US008274074B2

(12) United States Patent
Sekine et al.

(10) Patent No.: US 8,274,074 B2
(45) Date of Patent: Sep. 25, 2012

(54) POLYMER MATERIAL AND DEVICE USING THE SAME

(75) Inventors: Chizu Sekine, Tsukuba (JP); Nobuhiko Akino, Koshigaya (JP); Miho Ishikawa, Nakano-ku (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 450 days.

(21) Appl. No.: 11/997,161

(22) PCT Filed: Aug. 10, 2006

(86) PCT No.: PCT/JP2006/316124
§ 371 (c)(1),
(2), (4) Date: Feb. 27, 2010

(87) PCT Pub. No.: WO2007/020952
PCT Pub. Date: Feb. 22, 2007

(65) Prior Publication Data
US 2010/0283038 A1 Nov. 11, 2010

(30) Foreign Application Priority Data
Aug. 12, 2005 (JP) .................................. 2005-234319

(51) Int. Cl.
*H01L 35/24* (2006.01)
(52) U.S. Cl. .................................. 257/40; 257/E51.001
(58) Field of Classification Search .................... 257/40, 257/E51.001
See application file for complete search history.

(56) References Cited

U.S. PATENT DOCUMENTS

| 2003/0165716 A1 | 9/2003 | Samuel et al. |
|---|---|---|
| 2004/0002576 A1 | 1/2004 | Oguma et al. |
| 2004/0131880 A1 | 7/2004 | Zheng et al. |
| 2004/0133004 A1 | 7/2004 | Stossel et al. |
| 2004/0137263 A1 | 7/2004 | Burn et al. |
| 2004/0169461 A1 | 9/2004 | Moriyama et al. |
| 2004/0202892 A1 | 10/2004 | Yasuda et al. |
| 2004/0260047 A1 | 12/2004 | Chen et al. |
| 2005/0170202 A1 | 8/2005 | Tamao et al. |
| 2005/0244674 A1 | 11/2005 | Yasuda et al. |
| 2005/0253135 A1 | 11/2005 | Stossel et al. |
| 2007/0103059 A1 | 5/2007 | Tsubata et al. |
| 2007/0128466 A1 | 6/2007 | Nomura et al. |
| 2008/0100199 A1 | 5/2008 | Sekine et al. |
| 2008/0118773 A1 | 5/2008 | Mikami et al. |

FOREIGN PATENT DOCUMENTS

| JP | 2001-521053 A | 11/2001 |
|---|---|---|
| JP | 2004-002703 A | 1/2004 |
| JP | 2004-14155 A | 1/2004 |
| JP | 2004-059899 A | 2/2004 |
| JP | 2004-530254 A | 9/2004 |
| JP | 2004-292546 A | 10/2004 |
| JP | 2004-323823 A | 11/2004 |
| JP | 2004-533430 A | 11/2004 |
| JP | 2005-023071 A | 1/2005 |
| JP | 2005-105252 A | 4/2005 |
| JP | 2005-314505 A | 11/2005 |
| JP | 2006-188673 A | 7/2006 |
| JP | 2006-219663 A | 8/2006 |
| WO | WO 2004/037836 A1 | 5/2004 |
| WO | WO 2004/113421 A | 12/2004 |

OTHER PUBLICATIONS

Mitsunori Suzuki and Shizuo Tokito, "White Polymeric EL Element Employing Phosphorescent Material", Monthly Display 2002, vol. 8, No. 9, pp. 47-51.
A. Otomo et al., "Site-separation control using dendron molecular probes towards high-resolution photochemical reaction", Thin Solid Films, 499, 2006, pp. 35-39.
M.T. Bernius et al., "Progress with Light-Emitting Polymers", Advanced Materials, vol. 12, No. 23, Dec. 1, 2000, pp. 1737-1738.
Office Action issued May 31, 2011, in Japanese Patent Application No. 2006-362705 with English translation.

*Primary Examiner* — Anthony Ho
(74) *Attorney, Agent, or Firm* — Sughrue Mion, PLLC

(57) ABSTRACT

A polymer material comprising a composition containing a fluorescent conjugated polymer (A) and a phosphorescent compound (B) or comprising a polymer having the structure of (A) and the structure of (B) in the same molecule, wherein the following conditions (1), (2) and (3) are satisfied:

(1) at least one of the light emission peak wavelengths of the fluorescent conjugated polymer (A) is less than 500 nm,
(2) the light emission peak wavelengths of the phosphorescent compound (B) are not less than 500 nm,
(3) the following relation is satisfied:

$$ET_A - ES_{A\,0} \geq (ET_B - ES_{B0}) - 0.2 \text{ (unit; eV)} \quad (Eq\ 1)$$

(wherein, $ES_{A\,0}$ represents energy of the fluorescent conjugated polymer (A) at the ground state, $ET_A$ represents energy of the fluorescent conjugated polymer (A) at the lowest excited triplet state, $ES_{B\,0}$ represents energy of the phosphorescent compound (B) at the ground state, and $ET_B$ represents energy of the phosphorescent compound (B) at the lowest excited triplet state).

15 Claims, No Drawings

POLYMER MATERIAL AND DEVICE USING THE SAME

FIELD OF THE INVENTION

The present invention relates to a polymer material and a device using the same.

BACKGROUND TECHNOLOGY

Multicolor emitting and white emitting organic EL devices are expected to be applied to not only flat display panels but also many uses such as illumination and the like, thus, are recently in intense studies. For example, there is disclosed a white emitting device using a polymer material obtained by using polyvinyl carbazole as a light emitting host and adding to this a blue phosphorescent dopant, red phosphorescent dopant and low molecular weight electron transporting material (non-patent document 1: Monthly Display, 2002, vol. 8, no. 9, pp. 47 to 51 (published by Techno Times K.K.)). Further, a white emitting device is known using a polymer material obtained by using polyvinyl carbazole as a light emitting host and adding to this a blue fluorescent coloring matter, green phosphorescent coloring matter and red phosphorescent coloring matter (patent document 1: Japanese Patent Application Laid-Open (JP-A) No. 2004-14155).

The above-described organic EL devices (polymer light emitting device, polymer LED) using a polymer material are capable of manifesting white color emission and multicolor emission, however, have practically insufficient performances such as high driving voltage, insufficient light emission efficiency, and the like.

DISCLOSURE OF THE INVENTION

An object of the present invention is to provide a polymer material capable of giving a device which can manifest white color emission and multicolor emission and have excellent practical utilities such as drivability at low voltage, excellent light emission efficiency and the like.

That is, the present invention provides a polymer material comprising a composition containing a fluorescent conjugated polymer (A) and a phosphorescent compound (B) or comprising a polymer having the structure of (A) and the structure of (B) in the same molecule, wherein the following conditions (1), (2) and (3) are satisfied:

(1) at least one of the light emission peak wavelengths of the fluorescent conjugated polymer (A) is less than 500 nm, (2) the light emission peak wavelengths of the phosphorescent compound (B) are not less than 500 nm, (3) the following relation is satisfied:

$$ET_A - ES_{A\,0} \geq (ET_B - ES_B) - 0.2 \text{ (unit; eV)} \quad \text{(Eq 1)}$$

(wherein, $ES_{A\,0}$ represents energy of the fluorescent conjugated polymer (A) at the ground state, $ET_A$ represents energy of the fluorescent conjugated polymer (A) at the lowest excited triplet state, $ES_{B0}$ represents energy of the phosphorescent compound at the ground state, and $ET_B$ represents energy of the phosphorescent compound (B) at the lowest excited triplet state).

BEST MODE FOR CARRYING OUT THE INVENTION

The polymer material of the present invention comprises (i) a composition containing a fluorescent conjugated polymer (A) and a phosphorescent compound (B) or comprises (ii) a polymer having the structure of the fluorescent conjugated polymer (A) and the structure of the phosphorescence emitting molecule (B) in the same molecule.

The structure of the fluorescent conjugated polymer (A) in the polymer material of the present invention will be described.

The fluorescent conjugated polymer is a conjugated polymer showing at least fluorescence, and the conjugated polymer is a molecule containing multiple bonds and single bonds in a long line repeatedly as described, for example, in "Yuki EL no hanashi (topic of organic EL)" (Katsumi Yoshino, THE NIKKAN KOGYO SHIMBUN, LTD.), p. 23. As the fluorescent conjugated polymer, for example, polymers containing a repeating structure of the following structure or a structure containing the following structures in suitable combination are mentioned as typical examples.

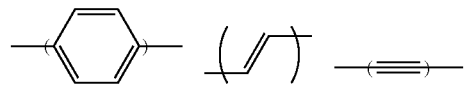

As the fluorescent conjugated polymer (A), those containing no aromatic ring in the main chain (for example, polyacetylenes) or those containing an aromatic ring in the main chain are mentioned, and from the standpoint of chemical stability of the polymer, those containing an aromatic ring in the main chain are preferable.

Preferable among those containing an aromatic ring in the main chain are those containing in the main chain an aromatic ring such as optionally substituted phenylene, fluorene, dibenzothiophene, dibenzofuran, dibenzosilole or the like as a repeating unit, as shown above, copolymers combining these aromatic rings, and copolymers combining further other repeating units. Specifically mentioned are polymer compounds having an optionally substituted benzene ring and/or the following general formula (1) as a partial structure.

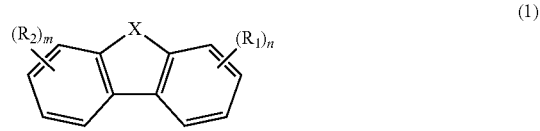

(wherein, m and n represent each independently an integer of 0 to 4, $R_1$ and $R_2$ represent each independently a hydrogen atom, halogen atom, alkyl group, alkoxy group, aryl group, or connecting bond with other atom. When there are a plurality of $R_1$s and a plurality of $R_2$s, they may be the same or different. X represents —O—, —S—, —Se—, —B($R_{31}$)—, —Si($R_{32}$)($R_{33}$)—, —P($R_{34}$)—, —PR$_4$(=O)—, —N($R_{35}$)—, —C($R_{36}$)($R_{37}$)—, —C($R_{51}$)($R_{52}$)—C($R_{53}$)($R_{54}$)—, —O—C($R_{55}$)($R_{56}$)—, —S—C($R_{57}$)($R_{58}$)—, —N—C($R_{59}$)($R_{60}$)—, —Si($R_{61}$)($R_{62}$)—C($R_{63}$)($R_{64}$)—, —Si($R_{65}$)($R_{66}$)—Si($R_{67}$)($R_{68}$)—, —C($R_{69}$)=C($R_{70}$)—, —N=C($R_{71}$)— or —Si($R_{72}$)=C($R_{73}$)—. Here, $R_{31}$ represents hydrogen, alkyl group, alkenyl group, alkynyl group, alkoxy group, alkylthio group, aryl group, aryloxy group, arylthio group, arylalkyl group, arylalkoxy group, arylalkylthio group, arylalkenyl group, arylalkynyl group, monovalent heterocyclic group or halogen atom. $R_{32}$ to $R_{37}$ and $R_{51}$ to $R_{73}$ represent each independently an alkyl group, alkenyl group, alkynyl group, alkoxy group, alkylthio group, aryl group, aryloxy group, arylthio group, arylalkyl group, arylalkoxy group, arylalkylthio group, arylalkenyl group, arylalkynyl group, monovalent heterocyclic group or halogen atom.).

Here, exemplified as the halogen atom are a fluorine atom, chlorine atom, bromine atom and iodine atom.

The alkyl group may be any of linear, branched or cyclic. The carbon number is usually about 1 to 10, preferably 3 to 10. Specifically, a methyl group, ethyl group, propyl group, i-propyl group, butyl group, i-butyl group, t-butyl group, pentyl group, hexyl group, cyclohexyl group, heptyl group, octyl group, 2-ethylhexyl group, nonyl group, decyl group, 3,7-dimethyloctyl group, lauryl group, trifluoromethyl group, pentafluoroethyl group, perfluorobutyl group, perfluorohexyl group, perfluorooctyl group and the like are mentioned, and preferable are a pentyl group, hexyl group, octyl group, 2-ethylhexyl group, decyl group and 3,7-dimethyloctyl group.

The alkenyl group may be any of linear, branched or cyclic. The carbon number is usually about 2 to 10, preferably 3 to 10. Specifically, an ethenyl group, propenyl group, butenyl group, pentenyl group, hexenyl group, heptenyl group and octenyl group are preferable.

The alkynyl group may be any of linear, branched or cyclic. The carbon number is usually about 2 to 10, preferably 3 to 10. Specifically, an ethynyl group, propynyl group, butynyl group, pentynyl group, hexynyl group, heptynyl group and octynyl group are preferable.

The alkoxy group may be any of linear, branched or cyclic. The carbon number is usually about 1 to 10, preferably 3 to 10. Specifically, a methoxy group, ethoxy group, propyloxy group, i-propyloxy group, butoxy group, i-butoxy group, t-butoxy group, pentyloxy group, hexyloxy group, cyclohexyloxy group, heptyloxy group, octyloxy group, 2-ethylhexyloxy group, nonyloxy group, decyloxy group, 3,7-dimethyloctyloxy group, lauryloxy group, trifluoromethoxy group, pentafluoroethoxy group, perfluorobutoxy group, perfluorohexyl group, perfluorooctyl group, methoxymethyloxy group, 2-methoxyethyloxy group and the like are mentioned, and preferable are a pentyloxy group, hexyloxy group, octyloxy group, 2-ethylhexyloxy group, decyloxy group and 3,7-dimethyloctyloxy group.

The alkylthio group may be any of linear, branched or cyclic. The carbon number is usually about 1 to 10, preferably 3 to 10. Specifically, a methylthio group, ethylthio group, propylthio group, i-propylthio group, butylthio group, i-butylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group, laurylthio group, trifluoromethylthio group and the like are mentioned, and preferable are a pentylthio group, hexylthio group, octylthio group, 2-ethylhexylthio group, decylthio group and 3,7-dimethyloctylthio group.

The aryl group has a carbon number of usually about 6 to 60, preferably 7 to 48. Specifically, a phenyl group, $C_1$ to $C_{12}$ alkoxyphenyl groups ($C_1$ to $C_{12}$ means a carbon number of 1 to 12. Applicable also in the later descriptions), $C_1$ to $C_{12}$ alkyiphenyl groups, 1-naphthyl group, 2-naphthyl group, 1-anthracenyl group, 2-anthracenyl group, 9-anthracenyl group, pentafluorophenyl group and the like are exemplified, and preferable are $C_1$ to $C_{12}$ alkoxyphenyl groups and $C_1$ to $C_{12}$ alkyiphenyl groups. Here, the aryl group is an atom group obtained by removing one hydrogen atom from an aromatic hydrocarbon. The aromatic hydrocarbon includes those having a condensed ring, and those obtained by bonding of two or more independent benzene rings or condensed rings directly or via a vinylene group and the like.

Specifically exemplified as the $C_1$ to $C_{12}$ alkoxy are methoxy, ethoxy, propyloxy, i-propyloxy, butoxy, i-butoxy, t-butoxy, pentyloxy, hexyloxy, cyclohexyloxy, heptyloxy, octyloxy, 2-ethyihexyloxy, nonyloxy, decyloxy, 3,7-dimethyloctyloxy, lauryloxy and the like.

Specifically exemplified as the $C_1$ to $C_{12}$ alkylphenyl group are a methylphenyl group, ethylphenyl group, dimethylphenyl group, propyiphenyl group, mesityl group, methylethylphenyl group, i-propylphenyl group, butylphenyl group, i-butylphenyl group, t-butylphenyl group, pentylphenyl group, isoamylphenyl group, hexylphenyl group, heptylphenyl group, octylphenyl group, nonylphenyl group, decyiphenyl group, dodecylphenyl group and the like.

The aryloxy group has a carbon number of usually about 6 to 60, preferably 7 to 48. Specifically, a phenoxy group, $C_1$ to $C_{12}$ alkoxyphenoxy groups, $C_1$ to $C_{12}$ alkyiphenoxy groups, 1-naphthyloxy group, 2-naphthyloxy group, pentafluorophenyloxy group and the like are exemplified, and preferable are $C_1$ to $C_{12}$ alkoxyphenoxy groups and $C_1$ to $C_{12}$ alkyiphenoxy groups.

Specifically exemplified as the $C_1$ to $C_{12}$ alkoxy are methoxy, ethoxy, propyloxy, i-propyloxy, butoxy, i-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy, lauryloxy and the like.

Specifically exemplified as the $C_1$ to $C_{12}$ alkylphenoxy group are a methylphenoxy group, ethylphenoxy group, dimethylphenoxy group, propylphenoxy group, 1,3,5-trimethylphenoxy group, methylethyiphenoxy group, i-propyiphenoxy group, butylphenoxy group, i-butylphenoxy group, t-butylphenoxy group, pentyiphenoxy group, isoamylphenoxy group, hexyiphenoxy group, heptylphenoxy group, octylphenoxy group, nonylphenoxy group, decylphenoxy group, dodecyiphenoxy group and the like.

The arylthio group has a carbon number of usually about 6 to 60 carbon atoms, preferably 7 to 48. Specifically, a phenylthio group, $C_1$ to $C_{12}$ alkoxyphenylthio groups, $C_1$ to $C_{12}$ alkylphenylthio groups, 1-naphthylthio group, 2-naphthylthio group, pentafluorophenylthio group and the like are exemplified, and preferable are $C_1$ to $C_{12}$ alkoxyphenylthio groups and $C_1$ to $C_{12}$ alkylphenylthio groups.

The arylalkyl group has a carbon number of usually about 7 to 60, preferably 7 to 48. Specifically, phenyl-$C_1$ to $C_{12}$ alkyl groups, $C_1$ to $C_{12}$ alkoxyphenyl-$C_1$ to $C_{12}$ alkyl groups, $C_1$ to $C_{12}$ alkylphenyl-$C_1$ to $C_{12}$ alkyl groups, 1-naphthyl-$C_1$ to $C_{12}$ alkyl groups, 2-naphthyl-$C_1$ to $C_{12}$ alkyl groups and the like are exemplified, and preferable are $C_1$ to $C_{12}$ alkoxyphenyl-$C_1$ to $C_{12}$ alkyl groups and $C_1$ to $C_{12}$ alkylphenyl-$C_1$ to $C_{12}$ alkyl groups.

The arylalkoxy group has a carbon number of usually about 7 to 60, preferably 7 to 48. Specifically, phenyl-$C_1$ to $C_{12}$ alkoxy groups such as a phenylmethoxy group, phenylethoxy group, phenylbutoxy group, phenylpentyloxy group, phenylhexyloxy group, phenylheptyloxy group, phenyloctyloxy group and the like, $C_1$ to $C_{12}$ alkoxyphenyl-$C_1$ to $C_{12}$ alkoxy groups, $C_1$ to $C_{12}$ alkylphenyl-$C_1$ to $C_{12}$ alkoxy groups, 1-naphthyl-$C_1$ to $C_{12}$ alkoxy groups, 2-naphthyl-$C_1$ to $C_{12}$ alkoxy groups and the like are exemplified, and preferable are $C_1$ to $C_{12}$ alkoxyphenyl-$C_1$ to $C_{12}$ alkoxy groups and $C_1$ to $C_{12}$ alkylphenyl-$C_1$ to $C_{12}$ alkoxy groups.

The arylalkylthio group has a carbon number of usually about 7 to 60, preferably 7 to 48. Specifically, phenyl-$C_1$ to $C_{12}$ alkylthio groups, $C_1$ to $C_{12}$ alkoxyphenyl-$C_1$ to $C_{12}$ alkylthio groups, $C_1$ to $C_{12}$ alkylphenyl-$C_1$ to $C_{12}$ alkylthio groups, 1-naphthyl-$C_1$ to $C_{12}$ alkylthio groups, 2-naphthyl-$C_1$ to $C_{12}$ alkylthio groups and the like are exemplified, and preferable are $C_1$ to $C_{12}$ alkoxyphenyl-$C_1$ to $C_{12}$ alkylthio groups and $C_1$ to $C_{12}$ alkylphenyl-$C_1$ to $C_{12}$ alkylthio groups.

The arylalkenyl group has a carbon number of usually about 7 to 60, preferably 7 to 48. Specifically, phenyl-$C_2$ to $C_{12}$ alkenyl groups, $C_1$ to $C_{12}$ alkoxyphenyl-$C_2$ to $C_{12}$ alkenyl groups, $C_1$ to $C_{12}$ alkylphenyl-$C_2$ to $C_{12}$ alkenyl groups, 1-naphthyl-$C_2$ to $C_{12}$ alkenyl groups, 2-naphthyl-$C_2$ to $C_{12}$ alkenyl groups and the like are exemplified, and preferable are $C_1$ to $C_{12}$ alkoxyphenyl-$C_2$ to $C_{12}$ alkenyl groups and $C_2$ to $C_{12}$ alkylphenyl-$C_1$ to $C_{12}$ alkenyl groups.

The arylalkynyl group has a carbon number of usually about 7 to 60 carbon atoms, preferably 7 to 48. Specifically, phenyl-$C_2$ to $C_{12}$ alkynyl groups, $C_1$ to $C_{12}$ alkoxyphenyl-$C_2$ to $C_{12}$ alkynyl groups, $C_1$ to $C_{12}$ alkylphenyl-$C_2$ to $C_{12}$ alkynyl groups, 1-naphthyl-$C_2$ to $C_{12}$ alkynyl groups, 2-naphthyl-$C_2$ to $C_{12}$ alkynyl groups and the like are exemplified, and preferable are $C_1$ to $C_{12}$ alkoxyphenyl-$C_2$ to $C_{12}$ alkynyl groups and $C_1$ to $C_{12}$ alkylphenyl-$C_2$ to $C_{12}$ alkynyl groups.

The monovalent heterocyclic group means an atom group remaining after removal of one hydrogen atom from a heterocyclic compound, and has a carbon number of usually about 4 to 60, preferably 4 to 20. The carbon number of the heterocyclic group does not include the carbon number of the substituent. Here, the heterocyclic compound includes organic compounds having a cyclic structure in which elements constituting the ring include not only a carbon atom but also hetero atoms such as oxygen, sulfur, nitrogen, phosphorus, boron and the like contained in the ring. Specifically, thienyl group, $C_1$~$C_{12}$ alkylthienyl groups, pyrrolyl group, furyl group, pyridyl group, $C_1$~$C_{12}$ alkylpyridyl groups, piperidyl group, quinolyl group, isoquinolyl group and the like are exemplified, and preferable are thienyl group, $C_1$~$C_{12}$ alkylthienyl groups, pyridyl group and $C_1$~$C_{12}$ alkylpyridyl groups.

As the compound of the general formula (1), the following compounds are exemplified.

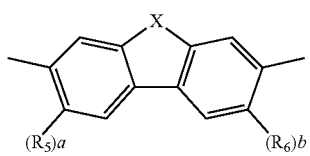

(2)

(wherein, $R_5$ and $R_6$ represent each independently a hydrogen atom, halogen atom, alkyl group, alkoxy group or aryl group. a and b represent each independently an integer of 0 or 1. $R_5$ and $R_6$ may be the same or different. X has the same meaning as described above.).

In the formula (2), Y is preferably —O—, —S— or —C($R_{36}$)($R_{37}$)—. Here, ($R_{36}$) and ($R_{37}$) have the same meanings as described above.).

The fluorescent conjugated polymer (A) to be used in the present invention may include copolymers containing other repeating units, in addition to those of the general formula (1). The other repeating units include the following (3) to (4):

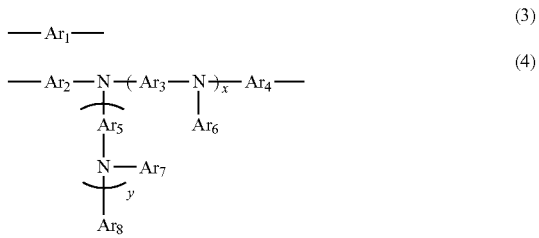

(wherein, $Ar_1$, $Ar_2$, $Ar_3$, $Ar_4$ and $Ar_5$ represent each independently an arylene group or divalent heterocyclic group. $Ar_5$, $Ar_6$, $Ar_7$ and $Ar_8$ represent each independently an aryl or monovalent heterocyclic group. $Ar_1$, $Ar_6$, $Ar_7$ and $Ar_8$ may have a substituent. x and y represent each independently 0 or 1, and 0=x+y=1.)

Here, the arylene group is an atom group obtained by removing two hydrogen atoms from an aromatic hydrocarbon, and has a carbon number of usually about 6 to 60, preferably 6 to 20. Here, the aromatic hydrocarbon includes those having a condensed ring, and those obtained by bonding of two or more independent benzene rings or condensed rings directly or via a vinylene group and the like. The following groups are exemplified.

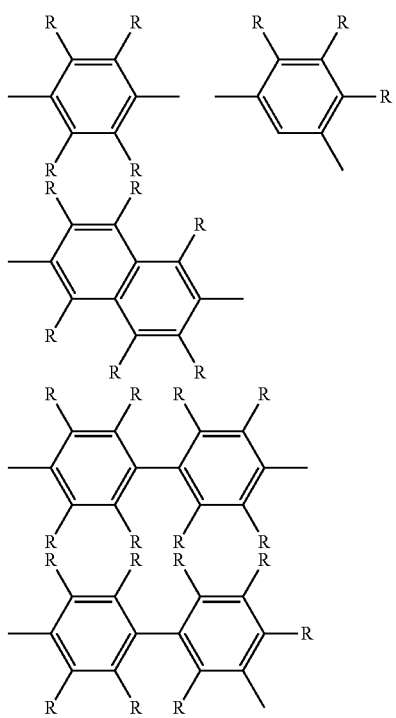

(wherein, R represents an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, silyloxy group or substituted silyloxy group, and a plurality of Rs in one group may be the same or different.).

The end group of the conjugated polymer to be used in the present invention may be protected by a stable group since if a polymerization active group remains intact, there is a possibility of decrease in a light emitting property and life when the compound is made into a device. Those having a conjugate bond sequential to a conjugate structure of the main chain are preferable, and exemplified are structures containing a bond to an aryl group or heterocyclic group via a carbon-carbon bond. Specifically, substituents described in the chemical formula 10 of JP-A No. 9-45478 are exemplified.

The conjugated polymer to be used in the present invention may be a random, block or graft copolymer, or a polymer having an intermediate structure of them, for example, a random copolymer with a block nature. From the standpoint of obtaining a polymer showing high quantum yield, random copolymers with a block nature, and block or graft copolymers are preferable more than complete random copolymers. The conjugated polymer of the present invention includes also those having branching in the main chain and three or more end parts, and dendrimers.

The conjugated polymer to be used in the present invention preferably has a polystyrene-reduced number average molecular weight of $10^3$ to $10^8$. More preferably, it is $10^4$ to $10^7$.

It is preferable from the standpoint of practical properties of an organic EL device such as driving voltage, light emission efficiency and the like that the fluorescent conjugated polymer (A) contained in a polymer material to be used in the present invention contains, though not particularly limited to, a structure of the above-described general formula (1) and also a structure of the general formula (4), in addition to satisfaction of the above-described conditions (1) to (3) in respect of a combination with the phosphorescent compound (B).

The method for production of the conjugated polymer to, be used in a polymer material of the present invention can be carried out, specifically, by dissolving a compound having several reactive substituents as a monomer, if necessary, in an organic solvent, and using, for example, an alkali and suitable catalyst, at temperatures not lower than the melting point and not higher than the boiling point of the organic solvent. Known methods described in, for example, Organic Reactions, vol. 14, p. 270 to 490, John Wiley & Sons, Inc., 1965, Organic Syntheses, Collective Volume VI, p. 407-411, John Wiley & Sons, Inc., 1988, Chem. Rev., vol. 95, p. 2457 (1995), J. Organomet. Chem., vol. 576, p. 147 (1999), Makromol. Chem., Macromol. Symp., vol. 12, p. 229 (1987), and the like can be used.

In the method for production of the conjugated polymer to be used in a polymer material of the present invention, a known condensation reaction can be used for performing condensation polymerization. In the case of production of a double bond in condensation polymerization, for example, a method described in JP-A No. 5-202355 is mentioned. That is, there are exemplified methods of polymerization of a compound having a formyl group and a compound having a phosphoniummethyl group or polymerization of a compound having a formyl group and a phosphoniummethyl group by the Wittig reaction, polymerization of a compound having a vinyl group and a compound having a halogen atom by the Heck reaction, polycondensation of a compound having two or more methyl monohalide groups by a de-hydrohalogenation method, polycondensation of a compound having two or more sulfoniummethyl groups by a sulfonium salt decomposition method, polymerization of a compound having a formyl group and a compound having a cyano group by the Knoevenagel reaction, and polymerization of a compound having two or more formyl groups by the McMurry reaction, and the like.

When the polymer of the present invention has a triple bond generated by condensation polymerization in the main chain, for example, the Heck reaction can be utilized.

When a double bond or triple bond is not generated, there are exemplified a method of polymerizing from the corresponding monomer by the Suzuki coupling reaction, a method of polymerizing by the Grignard reaction, a method of polymerizing with a nickel(0) complex, a method of polymerizing with an oxidizer such as $FeCl_3$ and the like, a method of electrochemically oxidation-polymerizing, a method by decomposition of an intermediate polymer having a suitable leaving group, and the like.

Of them, polymerization by the Wittig reaction, polymerization by the Heck reaction, polymerization by the Knoevenage reaction, method of polymerizing by the Suzuki coupling reaction, method of polymerizing by the Grignard reaction and method of polymerizing with a nickel zerovalent complex are preferable because of easy structure control.

When the reactive substituent on a raw material monomer for a polymer used in the present invention is a halogen atom, alkyl sulfonate group, aryl sulfonate group or aryl alkyl sulfonate group, a production method is preferable in which condensation polymerization is carried out in the presence a nickel zerovalent complex.

As the raw material compound, mentioned are dihalide compounds, bis(alkyl sulfonate) compounds, bis(aryl sulfonate) compounds, bis(aryl alkyl sulfonate) compounds, or halogen-alkyl sulfonate compounds, halogen-aryl sulfonate compounds, halogen-aryl alkyl sulfonate compounds, alky sulfonate-aryl sulfonate compounds, alkyl sulfonate-aryl alkyl sulfonate compounds and aryl sulfonate-aryl alkyl sulfonate compounds.

When the reactive substituent on a raw material monomer for a polymer used in the present invention is a halogen atom, alkyl sulfonate group, aryl sulfonate group, aryl alkyl sulfonate group, boric group or borate group, a production method is preferable in which the ratio of the sum of mol numbers of halogen atoms, alkyl sulfonate groups, aryl sulfonate groups and aryl alkyl sulfonate groups to the sum of mol numbers of boric group and borate groups is substantially 1 (usually, in the range of 0.7 to 1.2) and condensation polymerization is carried out using a nickel or palladium catalyst.

As specific combinations of raw material compounds, mentioned are combinations of dihalide compounds, bis (alkyl sulfonate) compounds, bis(aryl sulfonate) compounds or bis(aryl alkyl sulfonate) compounds with diboric acid compounds or diborate compounds.

Further mentioned are halogen-boric acid compounds, halogen-borate compounds, alkyl sulfonate-boric acid compounds, alkyl sulfonate-borate compounds, aryl sulfonate-boric acid compounds, aryl sulfonate-borate compounds, aryl alkyl sulfonate-boric acid compounds, aryl alkyl sulfonate-boric acid compounds, aryl alkyl sulfonate-borate compounds.

The organic solvent varies depending on the compound and reaction to be used, and it is preferable that the solvent to be used is subjected to a deoxidation treatment sufficiently and the reaction is allowed to progress under an inert atmosphere, in general for suppressing side reactions. Likewise, a dehydration treatment is preferably conducted. Here, a case of a reaction in a two-phase system with water such as the Suzuki coupling reaction is not included.

For reaction, alkalis or suitable catalysts are appropriately added. These may be advantageously selected depending on the reaction to be used. As the alkalis or catalysts, those capable of being dissolved sufficiently in a solvent used in the reaction are preferable. As the method for mixing an alkali or catalyst, there is exemplified a method in which a solution of an alkali or catalyst is added slowly while stirring the reaction liquid under an inert atmosphere such as argon or nitrogen and the like, or adversely, the reaction liquid is added slowly to a solution of an alkali or catalyst.

When the polymer used in the present invention is used in a polymer LED and the like, the purity thereof has an influence on performances of a device such as a light emitting property and the like, thus, it is preferable that monomers before polymerization are purified by a method such as distillation, sublimation purification, re-crystallization and the like before performing polymerization. It is preferable, after polymerization, to perform a refinement treatment such as fractionation by chromatography, and the like.

Next, the phosphorescent compound (B) in a polymer material of the present invention will be described.

The phosphorescent compound shows light emission from the triplet excited state, and those having a metal complex structure are mentioned.

As those having a metal complex structure showing light emission from the triplet excited state among phosphorescent compounds, for example, those conventionally used as a lower molecular weight EL light emitting material, and the like are mentioned. These are disclosed in Nature, (1998), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71(18), 2596, Syn. Met., (1998), 94(1), 103, Syn. Met., (1999), 99(2), 1361, Adv. Mater., (1999), 11(10), 852, WO 02/06652, Journal of the SID, 11/1, 161-166 (2003), and the like. Particularly, it is preferable that the sum of orbital coefficients of the outermost d orbital of a center metal in the highest occupied molecular orbital (HOMO) of a metal complex is not less than 0.3, from the standpoint of obtaining high efficiency. It is preferable that the metal complex is neutral from the standpoint of obtaining high EL efficiency.

The center metal of the phosphorescence emitting complex is usually a metal which is an atom having an atomic number of not less than 50, shows a spin-orbital mutual action with the complex, and is capable of causing intersystem crossing between the singlet state and the triplet state, and for example, gold, platinum, iridium, osmium, rhenium, tungsten, europium, terbium, thulium, dysprosium, samarium, praseodymium, gadolinium and ytterbium atoms are preferable, gold, platinum, iridium, osmium, rhenium and tungsten atoms are more preferable, gold, platinum, iridium, osmium and rhenium atoms are further preferable, and gold, platinum, iridium and rhenium atoms are most preferable.

Regarding the ligand of the phosphorescence emitting complex, it is preferable that carbon is included in coordinating atoms from the standpoint of obtaining high efficiency, and for example, 2-phenylpyridine, 2-phenylquinoline, 1-phenylisoquinoline, 2 or 3-phenylquinoxaline, benzo[h]quinoline and derivatives thereof, and the like are mentioned. The ligand may, for improvement of solubility, have a substituent in a range not deteriorating light emitting property.

Examples of the phosphorescence emitting complex are shown below.

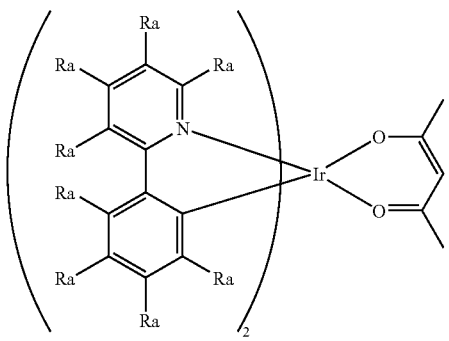

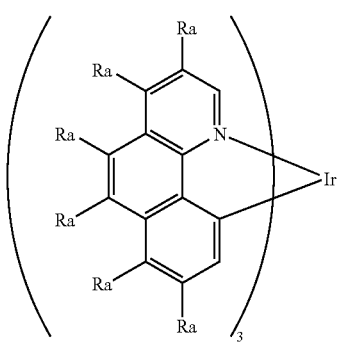

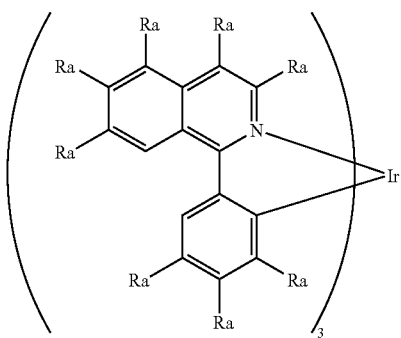

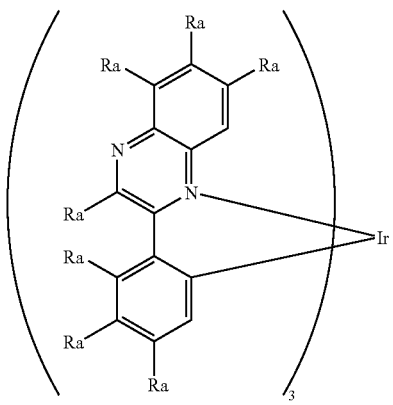

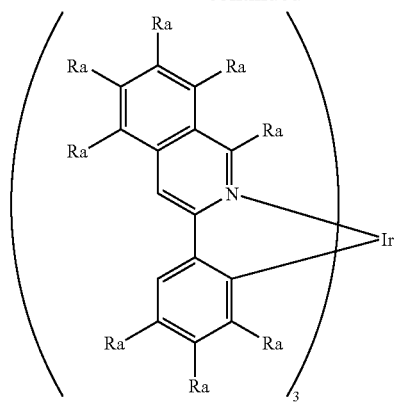

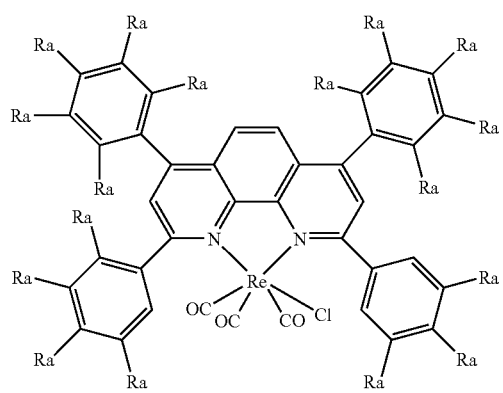

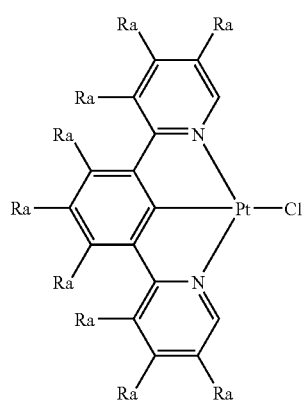

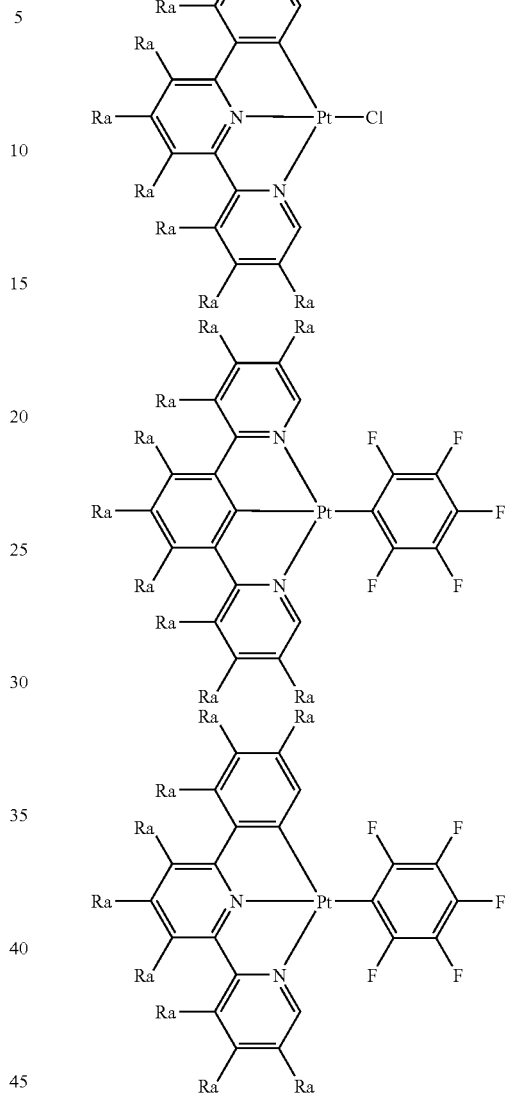

(wherein, Ra in the above-described compounds represents an alkyl group optionally substituted partially by fluorine, an optionally substituted arylene group, or halogen atom, and a plurality of Ra's in the same compound may be the same or different.).

The polymer material of the present invention satisfied the following conditions (1), (2) and (3).

(1) at least one of the light emission peak wavelengths of the fluorescent conjugated polymer (A) is less than 500 nm, (2) the light emission peak wavelengths of the phosphorescent compound (B) are not less than 500 nm, (3) the following relation is satisfied:

$$ET_A - ES_{A\,0} \geq (ET_B - ES_B) - 0.2 \text{ (unit; eV)} \tag{Eq 1}$$

(wherein, $ES_{A\,0}$ represents energy of the fluorescent conjugated polymer (A) at the ground state, $ET_A$ represents energy of the fluorescent conjugated polymer (A) at the lowest excited triplet state, $ES_{B\,0}$ represents energy of the phosphorescent compound (B) at the ground state, and $ET_B$ represents energy of the phosphorescent compound (B) at the lowest excited triplet state).

The light emission peak wavelengths of a phosphorescence emitting molecule are indispensably longer than the light emission peak wavelengths of a fluorescent conjugated polymer from the standpoint of obtaining light emission of high efficiency, and it is necessary in particular that light emission of the fluorescent conjugated polymer occurs in a region near blue light emission.

Differences in energy between the ground state and the lowest excited triplet state of the fluorescent conjugated polymer and the phosphorescence emitting molecule showing light emission from the triplet excited state in the above-described (Eq 1) ($ET_A-TS_{A0}$, $ET_B-ES_{B0}$, in this order) can be actually measured in some methods, however, in the present invention, relative magnitude correlation of the above-described energy difference of the phosphorescence emitting molecule and the above-described energy difference of the fluorescent conjugated polymer to be used as a matrix is usually important for obtaining higher light emission efficiency, thus, the difference is determined by a computational scientific means.

When the phosphorescent compound (A) has a metal complex structure, the proportion of the sum of squares of orbital coefficients of the outermost d orbital of a center metal in the highest occupied molecular orbital (HOMO) calculated by a computational scientific means occupying the sum of squares of all atom orbital coefficients is preferably not less than one-third, in a range satisfying the above-described (Eq 1), from the standpoint of obtaining high brilliance and high light emission efficiency, further, more preferably not less than two-fifth.

As the computational scientific means for calculating energy at the ground state and energy at the lowest excited triplet state of the fluorescent polymer and phosphorescence emitting material, and the occupying proportion of the sum squares of orbital coefficients of the outermost d orbital in HOMO of a metal complex, there are known a molecular orbital method, density function method and the like based on semi-empirical methods and non-empirical methods. In the present invention, using a quantum chemical calculation program Gaussian 98, an optimized structure at the ground state of a triplet light emitting compound was calculated by a density function, and HOMO energy level at the ground state and LUMO energy level at the ground state and population of each orbital in HOMO were analyzed, thus, the proportion of the sum of squares of orbital coefficients of the outermost d orbital of a center metal in HOMO occupying the sum of squares of all atom orbital coefficients were calculated. Further, using a time-dependent density function method, a difference in energy between the ground state and the lowest excited triplet state (hereinafter, referred to as lowest excited triplet energy) and a difference in energy between the ground state and the lowest excited singlet state (hereinafter, referred to as lowest excited singlet energy) of the compound were calculated. For the conjugated polymer, the optimum structure at the ground state was found using the Hartree Fock method (hereinafter, referred to as HF method in some cases) and, the lowest excited triplet energy of the conjugated polymer was calculated using a time-dependent density function method. When the metal complex has a side chain such as an alkyl group and the like on a ligand, a structure excepting the substituent was used as the calculation subject structure. For population analysis on the metal complex, a method described in a non-patent document (JOURNAL OF PHYSICAL CHEMISTRY A 2002, Vol. 106, p 1634) was used.

Calculations of the lowest excited triplet energy and lowest excited singlet energy, HOMO energy level at the ground state and LUMO energy level at the ground state, of the conjugated polymer, were performed for a monomer (n=1), a dimmer (n=2) and a trimer (n=3), and for the excitation energy of the conjugated polymer, a method was used in which results when n=1 to 3 are treated by a function E(1/n) for 1/n (wherein, E represents an excitation energy value to be estimated such as lowest excited singlet energy, lowest excited triplet energy and the like) and extrapolated linearly into n=0. When a side chain having large chain length and the like, for example, was contained in a repeating unit of the conjugated polymer, a side chain portion of the chemical structure as a calculation subject was simplified into the minimum unit (for example, when an octyl group is present as a side chain, calculation is performed hypothesizing the side chain as a methyl group). Further, for the singlet excited energy and triplet excited energy in the copolymer, the minimum unit estimated from the copolymerization ratio was used as a unit, and the same calculation method was carried out as for the above-described homopolymer case. The resultant calculation value was corrected with a conversion factor obtained based on an actually measured value described in Journal of American Chemical Society, Vol. 123, 4304 (2001).

Further, for HOMO, LUMO, single excitation energy and triplet excitation energy of the copolymer, the same calculation method can be carried out as for the above-described homopolymer case, using the minimum unit estimated from the copolymerization ratio as a unit.

The polymer material of the present invention includes the following two embodiments as described above.

(i) A polymer material comprising a composition containing a fluorescent conjugated polymer (A) and a phosphorescent compound (B), and (ii) a polymer material comprising a polymer having the structure of the fluorescent conjugated polymer (A) and the structure of the phosphorescent compound (B) in the same molecule.

The amounts of the fluorescent conjugated polymer (A) and the phosphorescent compound (B) in the above-described (i) and the amounts of the structure of the fluorescent conjugated polymer (A) and the structure of the phosphorescent compound (B) in the above-described (ii) are not particularly restricted since they vary depending on the kind of the fluorescent conjugated polymer to be combined and on the property to be optimized, however, if the amount of the fluorescent conjugated polymer (A) is 100 parts by weight, then, the amount of the phosphorescent compound (B) is usually 0.01 to 40 parts by weight, preferably 0.1 to 10 parts by weight, further preferably 0.1 to 1 part by weight. Particularly when a plurality of phosphorescent compounds showing different light emission peak wavelengths are contained, it is preferable that the content of molecules showing longer light emission peaks is smaller from the standpoint of multicolor light emission.

When the polymer material of the present invention is in the case the above-described embodiment (i), mentioned as examples of the polymer having the structure of the fluorescent conjugated polymer (A) and the structure of the phosphorescent compound (B) in the same molecule are a polymer having the structure of the phosphorescent compound (B) on the main chain of the fluorescent conjugated polymer (A); a polymer having the structure of the phosphorescent compound (B) on the end of the fluorescent conjugated polymer (A); and a polymer having the structure of the phosphorescent compound (B) on the side chain of the fluorescent conjugated polymer (A);

As examples of the polymer according to the above-described embodiment (i), mentioned are polymers containing a partial structure of the general formula (1), having a polystyrene-reduced number average molecular weight of $10^3$ to $10^8$, and having the structure of a phosphorescent compound on the side chain, main chain and/or end.

The polymer structure having the structure of the phosphorescent compound (B) on the side chain of the fluorescent conjugated polymer (A) is represented, for example, by the following formula.

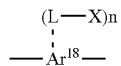

(wherein, $Ar^{18}$ represents a divalent aromatic group, or a divalent heterocyclic group having one or more atoms selected from the group consisting of an oxygen atom, silicon atom, germanium atom, tin, atom, phosphorus atom, boron atom, sulfur atom, selenium atom and tellurium atom, and the $Ar^{18}$ represents 1 to 4-L-X groups, X represents a monovalent group showing light emission from the triplet excited state, L represents a single bond, —O—, —S—, —CO—, —CO$_2$—, —SO—, —SO$_2$—, —SiR$^{68}$R$^{69}$—, NR$^{70}$—, —BR$^{71}$—, —PR$^{72}$—, —P(=O)(R$^{73}$)—, optionally substituted alkylene group, optionally substituted alkenylene group, optionally substituted alkynylene group, optionally substituted arylene group or optionally substituted divalent heterocyclic group, and when the alkylene group, alkenyl group and alkynylene group contain a —CH$_2$— group, one or more —CH$_2$— groups contained in the alkylene group, one or more —CH$_2$— groups contained in the alkenylene group and one or more —CH$_2$— groups contained in the alkynylene group may be substituted by a group selected from the group consisting of —O—, —S—, —CO—, —CO$_2$—, —SO—, —SO$_2$—, —SiR$^{74}$R$^{75}$—, NR$^{76}$—, —BR$^{77}$—, —PR$^{78}$— and —P(=O)(R$^{79}$)—. R$^{68}$, R$^{69}$, R$^{70}$, R$^{71}$, R$^{72}$, R$^{73}$, R$^{74}$, R$^{75}$, R$^{76}$, R$^{77}$, R$^{7}$, and R$^{79}$ represent each independently a group selected from the group consisting of a hydrogen atom, alkyl group, aryl group, monovalent heterocyclic group and cyano group. $Ar^{18}$ may have further an alkyl group, alkoxy group, alkylthio group, aryl group, aryloxy group, arylthio group, arylalkyl group, arylalkoxy group, arylalkylthio group, arylalkenyl group, arylalkynyl group, amino group, substituted amino group, silyl group, substituted silyl group, halogen atom, acyl group, acyloxy group, imine residue, amide group, acid imide group, monovalent heterocyclic group, carboxyl group, substituted carboxyl group and cyano group, in addition to a group of -L-X. When $Ar^{18}$ have a plurality of substituents, they may be the same or different, or they may be mutually different. n represents an integer of 1 to 4.).

Herein, examples of the divalent aromatic group includes phenylene, pyridinylene, pyrimidilene, naphthylene or rings as represented by the above-described general formula (1).

The polymer structure having the structure of the phosphorescent compound (B) on the main chain of the fluorescent conjugated polymer (A) is represented, for example, by the following formulae.

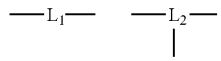

(wherein, $L_1$ and $L_2$ represent the structure of a phosphorescence emitting molecule, and the connecting bond in the formula is connected to a repeating unit with which the structure of the phosphorescence emitting molecule forms the polymer main chain.).

The polymer structure having the structure of the phosphorescent compound (B) on the end of the fluorescent conjugated polymer (A) is represented, for example, by the following formulae.

(wherein, $L_3$ represents a monovalent group containing the structure of the phosphorescent compound (B), and the connecting bond is held on the phosphorescence emitting molecule (B) material and is connected to X. X represents a single bond, optionally substituted alkenylene group, optionally substituted alkynylene group, optionally substituted arylene group or optionally substituted divalent heterocyclic group.).

A polymer having the structure of the phosphorescent compound (B) on the side chain, main chain or end can be produced by the above-described method using, for example, a monomer having a phosphorescence emitting part as one of raw materials.

The polymer material of the present invention may further contain at least one material selected from hole transporting materials, electron transporting materials and light emitting materials.

The liquid composition of the present invention will be described,

The composition and polymer compound of the present invention are useful particularly as a liquid composition for production of a light emitting device such as a polymer light emitting device and the like. The liquid composition is composed of the polymer material of the present invention (composition and polymer compound) containing, if necessary, a solvent. In the present specification, "liquid composition" means that which is liquid in producing a device, and typically, means that which is liquid at normal pressure (namely, 1 atom) and 25° C. The liquid composition is, in general, called ink, ink composition, solution or the like in some cases.

In the case of film formation using this liquid composition (for example, composition in solution condition, and the like), in producing a polymer light emitting device, it may be advantages only to apply the liquid composition before removal of a solvent by drying, and also in the case of mixing of a charge transporting material and a light emitting material, the same means can be applied, thus, it is very useful for production. Drying may be carried out under condition of heating to about 50 to 150° C., and may also be carried out under a reduced pressure of about $10^{-3}$ Pa.

As the film formation method using a liquid composition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

The proportion of a solvent in the liquid composition is usually 1 wt % to 99.9 wt %, preferably 60 wt % to 99.9 wt %, further preferably 90 wt % to 99.8 wt % based on the total weight of the liquid composition. Though the viscosity of the liquid composition varies depending on the printing method, a range of 0.5 to 500 mPa·s is preferable at 25° C., and when the liquid composition passes through a discharging apparatus such as in an ink jet printing method and the like, the viscosity at 25° C. is preferably in the range from 2 to 20 mPa·s for preventing clogging and aviation curve in discharging. The sum of weights of a polymer containing repeating units of the above-described formulae (1-1) and (1-2) and a compound showing phosphorescence emission, or the weight of the above-described polymer compound is usually 20 wt % to 100 wt %, preferably 40 wt % to 100 wt % based on the total weight of all components left after removing a solvent from the liquid composition.

As the solvent to be contained in the liquid composition, those capable of dissolving or dispersing components other than the solvent in the liquid composition are preferable. Exemplified as the solvent are chlorine-based solvents such as chloroform, methylene chloride, 1,2-dichloroethane, 1,1,2-trichloroethane, chlorobenzene, o-dichlorobenzene and the like, ether solvents such as tetrahydrofuran, dioxane and the like, aromatic hydrocarbon solvents such as toluene, xylene, trimethylbenzene, mesitylene and the like, aliphatic hydrocarbon solvents such as cyclohexane, methylcyclohexane, n-pentane, n-hexane, n-heptane, n-octane, n-nonane, n-decane and the like, ketone solvents such as acetone, methyl ethyl ketone, cyclohexanone and the like, ester solvents such as ethyl acetate, butyl acetate, methyl benzoate, ethyl cellosolve acetate and the like, polyhydric alcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, 1,2-hexanediol and the like and derivatives thereof, alcohol solvents such as methanol, ethanol, propanol, isopropanol, cyclohexanol and the like, sulfoxide solvents such as dimethyl sulfoxide and the like, and amide solvents such as N-methyl-2-pyrrolidone, N,N-dimethylformamide and the like. These solvents may be used singly or in combination of two or more. Of the above-described solvents, at least one organic solvent having a structure containing at least one benzene ring and having a melting point of not higher than 0° C. and a boiling point of not lower than 100° C. is preferably contained from the standpoint of viscosity, film formability and the like.

Regarding the kind of the solvent, aromatic hydrocarbon solvents, aliphatic hydrocarbon solvents, ester solvents and ketone solvents are preferable from the standpoint of dissolvability into an organic solvent of other components than the solvent in the liquid composition, uniformity in film formation, viscosity property and the like, and toluene, xylene, ethylbenzene, diethylbenzene, trimethylbenzene, mesitylene, n-propylbenzene, propylbenzene, n-butylbenzene, i-butylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone, and dicyclohexylketone are preferable, and at least one of xylene, anisole, mesitylene, cyclohexylbenzene, bicyclohexyl and methyl benzoate is more preferably contained.

The number of the kinds of solvents contained in the liquid composition is preferably 2 or more, more preferably 2 to 3, further preferably 2, from the standpoint of film formability and from the standpoint of device properties and the like.

When two solvents are contained in the liquid composition, one solvent of them may be in solid state at 25° C. From the standpoint of film formability, it is preferable that one solvent has a boiling point of not lower than 180° C. and another solvent has a boiling point of not higher than 180° C., and it is more preferable that one solvent has a boiling point of not lower than 200° C. and another solvent has a boiling point of higher than 180° C. From the standpoint of viscosity, it is preferable that not less than 0.2 wt % of components left after removal of solvents from the liquid composition are dissolved in solvents at 60° C., and it is preferable that not less than 0.2 wt % of components left after removal of solvents from the liquid composition are dissolved in one of two solvents at 25° C.

When three solvents are contained in the liquid composition, one to two solvents of them may be in solid state at 25° C. From the standpoint of film formability, it is preferable that at least one of three solvents has a boiling point of not lower than 180° C. and at least one solvent has a boiling point of not higher than 180° C., and it is more preferable that at least one of three solvents has a boiling point of not lower than 200° C. and not higher than 300° C. and at least one solvent has a boiling point of not higher than 180° C. From the standpoint of viscosity, it is preferable that not less than 0.2 wt % of components left after removal of solvents from the liquid composition are dissolved in two of three solvents at 60° C., and it is preferable that not less than 0.2 wt % of components left after removal of solvents from the liquid composition are dissolved in one of three solvents at 25° C.

When two or more solvents are contained in the liquid composition, the proportion of a solvent having the highest boiling point is preferably 40 to 90 wt %, more preferably 50 to 90 wt %, further preferably 65 to 85 wt % based on the weight of all solvents contained in the liquid composition from the standpoint of viscosity and film formability.

As the solvent contained in the liquid composition, preferable from the standpoint of viscosity and film formability are a combination of anisole and bicyclohexyl, a combination of anisole and cyclohexylbenzene, a combination of xylene and bicyclohexyl, a combination of xylene and cyclohexylbenzene, and a combination of mesitylene and methyl benzoate.

From the standpoint of solubility of other components than a solvent contained in the composition into the solvent, the difference between solubility parameter of the solvent and solubility parameter of the polymer contained in the composition of the present invention or the polymer compound of the present invention is preferably not more than 10, more preferably not more than 7. These solubility parameters can be measured by a method described in "Solvent Handbook (Kodansha Ltd. Publishers, 1976)".

Next, the light emitting device of the present invention will be described.

The light emitting device of the present invention is characterized in that it has a layer containing a polymer material of the present invention between electrodes composed of an anode and a cathode.

The light emitting device is characterized in that it has further a charge transport layer and/or charge block layer between electrodes composed of an anode and a cathode.

Listed as the above-described light emitting device are a polymer LED having an electron transport layer provided between a cathode and a light emitting layer, a polymer LED having a hole transport layer provided between an anode and a light emitting layer, a polymer LED having an electron transport layer provided between a cathode and a light emitting layer, and having a hole transport layer provided between an anode and a light emitting layer, a polymer LED having a hole block layer provided between a light emitting layer and a cathode, and the like. Here, the light emitting layer is a layer having a function of emitting light, the hole transport layer is a layer having a function of transporting holes, and the electron transport layer is a layer having a function of transporting electrons. The electron transport layer and hole transport layer are collectively called a charge transport layer. The charge block layer means a layer having a function of confining holes or electrons in a light emitting layer, and a layer transporting electrons and confining holes is called a hole block layer, and a layer transporting holes and confining electrons is called an electron block layer.

Further mentioned are a polymer LED having a layer containing an electric conductive polymer provided between at least one electrode described above and a light emitting layer and adjacent to the electrode; and a polymer LED having a buffer layer having an average thickness of not more than 2 nm provided between at least one electrode and a light emitting layer and adjacent to the electrode.

Specifically, the following structures a) to d) are exemplified.

a) anode/light emitting layer/cathode b) anode/hole transport layer/light emitting layer/cathode c) anode/light emitting layer/electron transport layer/cathode d) anode/hole transport layer/light emitting layer/electron transport layer/cathode (wherein, / denotes adjacent lamination of layers, applicable also in the following descriptions)

Among charge transport layers provided adjacent to an electrode, those having a function of improving charge injection efficiency from the electrode and having an effect of lowering the driving voltage of the device are particularly called a charge injection layer (hole injection layer, electron injection layer) in general.

For improvement in close adherence with an electrode and improvement of charge injection from an electrode, the above-described charge injection layer or insulation layer having a thickness of not more than 2 nm may be provided adjacent to the electrode, and for improvement in close adherence of the interface and prevention of mixing, and the like, a thin buffer layer may be inserted in the interface of a charge transport layer or a light emitting layer.

Further, a hole block layer may be inserted in the interface of a light emitting layer for transporting electrons and confining holes.

The order and numbers of layers to be laminated and the thickness of each layer can be appropriately determined in view of light emission efficiency and device life.

In the present invention, mentioned as the polymer LED having a charge injection layer (electron injection layer, hole injection layer) are a polymer LED having a charge injection layer provided adjacent to a cathode and a polymer LED having a charge injection layer provided adjacent to an anode.

For example, the following structures e) to p) are specifically mentioned.

e) anode/charge injection layer/light emitting layer/cathode f) anode/light emitting layer/charge injection layer/cathode g) anode/charge injection layer/light emitting layer/charge injection layer/cathode h) anode/charge injection layer/hole transport layer/light emitting layer/cathode i) anode/hole transport layer/light emitting layer/charge injection layer/cathode j) anode/charge injection layer/hole transport layer/light emitting layer/charge injection layer/cathode k) anode/charge injection layer/light emitting layer/electron transport layer/cathode l) anode/light emitting layer/electron transport layer/charge injection layer/cathode m) anode/charge injection layer/light emitting layer/electron transport layer/charge injection layer/cathode n) anode/charge injection layer/hole transport layer/light emitting layer/charge transport layer/cathode o) anode/hole transport layer/light emitting layer/electron transport layer/charge injection layer/cathode p) anode/charge injection layer/hole transport layer/light emitting layer/electron transport layer/charge injection layer/cathode As specific examples of the charge injection layer, exemplified are a layer containing an electric conductive polymer, a layer provided between an anode and a hole transport layer and containing a material having ionization potential of a value between an anode material and a hole transportint material contained in a hole transport layer, a layer provided between a cathode and an electron transport layer and containing a material having electron affinity of a value between a cathode material and an electron transporting material contained in an electron transport layer, and the like.

When the above-mentioned charge injection layer is a layer containing an electric conductive polymer, the electric conductivity of the electric conductive polymer is preferably not less than $10^{-5}$ S/cm and not more than $10^3$, and for decreasing leak current between light emission picture elements, more preferably not less than $10^{-5}$ S/cm and not more than $10^2$, further preferably not less than $10^{-5}$ S/cm and not more than $10^1$ or less.

Usually, for adjusting the electric conductivity of the electric conductive polymer to not less than $10^{-5}$ S/cm and not more than $10^{-3}$ S/cm, the electric conductive polymer is doped with a suitable amount of ions.

As the kind of ions to be doped, an anion is used in a hole injection layer and a cation is used in an electron injection layer. Examples of the anion include a polystyrenesulfonic ion, alkylbenzenesulfonic ion, camphorsulfonic ion and the like, and examples of the cation include a lithium ion, sodium ion, potassium ion, tetrabutylammonium ion and the like.

The thickness of the charge injection layer is, for example, 1 nm to 100 nm, preferably 2 nm to 50 nm.

The material used in the charge injection layer may be appropriately selected depending on a relation with the material of an electrode and an adjacent layer, and exemplified are polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, electric conductive polymers such as polymers containing an aromatic amine structure in the main chain or side chain, metal phthalocyanine (copper phthalocyanine and the like), carbon and the like.

The insulation layer having a thickness of not more than 2 nm has a function of making charge injection easy. As the material of the above-described insulation layer, metal fluorides, metal oxides, organic insulation materials and the like are mentioned. As the polymer LED carrying having the insulation layer having a thickness of not more than 2 nm, there are mentioned a polymer LED in which an insulation layer having a thickness of not more than 2 nm is provided adjacent to a cathode, and a polymer LED in which an insulation layer having a thickness of not more than 2 nm is provided adjacent to an anode.

Specifically, the following structures q) to ab) are mentioned, for example.

q) anode/insulation layer having a thickness of not more than 2 nm/light emitting layer/cathode r) anode/light emitting layer/insulation layer having a thickness of not more than 2 nm/cathode s) anode/insulation layer having a thickness of not more than 2 nm/light emitting layer/insulation layer having a thickness of not more than 2 nm/cathode t) anode/insulation layer having a thickness of not more than 2 nm/hole transport layer/light emitting layer/cathode u) anode/hole transport layer/light emitting layer/insulation layer having a thickness of not more than 2 nm/cathode v) anode/insulation layer having a thickness of not more than 2 nm/hole transport layer/light emitting layer/insulation layer having a thickness of not more than 2 nm/cathode w) anode/insulation layer having a thickness of not more than 2 nm/light emitting layer/electron transport layer/cathode x) anode/light emitting layer/electron transport layer/insulation layer having a thickness of not more than 2 nm/cathode y) anode/insulation layer having a thickness of not more than 2 nm/light emitting layer/electron transport layer/insulation layer having a thickness of not more than 2 nm/cathode z) anode/insulation layer having a thickness of not more than 2 nm/hole transport layer/light emitting layer/electron transport layer/cathode aa) anode/hole transport layer/light emitting layer/electron transport layer/insulation layer having a thickness of not more than 2 nm/cathode ab) anode/insulation layer having a thickness of not more than 2 nm/hole transport layer/light emitting layer/electron transport layer/insulation layer having a thickness of not more than 2 nm/cathode The hole block layer has a function of transporting electrons and confining holes transported from an anode, and is provided in an interface at the cathode side of a light emitting layer, and is constituted of a material having ionization potential larger than ionization potential of a light emitting layer, for example, Bathocuproine, metal complexes of 8-hydroxyquinoline or its derivatives, and the like.

The hole block layer has a thickness of, for example, 1 nm to 100 nm, preferably 2 nm to 50 nm.

Specifically, the following structures ac) to an) are mentioned, for example.

ac) anode/charge injection layer/light emitting layer/hole block layer/cathode ad) anode/light emitting layer/hole block layer/charge injection layer/cathode ae) anode/charge injection layer/light emitting layer/hole block layer/charge injection layer/cathode af) anode/charge injection layer/hole transport layer/light emitting layer/hole block layer/cathode ag) anode/hole transport layer/light emitting layer/hole block layer/charge injection layer/cathode ah) anode/charge injection layer/hole transport layer/light emitting layer/hole block layer/charge injection layer/cathode ai) anode/charge injection layer/light emitting layer/hole block layer/charge transport layer/cathode aj) anode/light emitting layer/hole block layer/electron transport layer/charge injection layer/cathode ak) anode/charge injection layer/ight emitting layer/hole block layer/electron transport layer/charge injection layer/cathode al) anode/charge injection layer/hole transport layer/light emitting layer/hole block layer/charge transport layer/cathode am) anode/hole transport layer/light emitting layer/hole block layer/electron transport layer/charge injection layer/anode an) anode/charge injection layer/hole transport layer/light emitting layer/hole block layer/electron transport layer/charge injection layer/anode As the method for forming a light emitting layer, for example, a method of film formation from a liquid composition is mentioned. As the method of film formation from a liquid composition, there can be used application methods such as a spin coat method, casting method, micro gravure coat method, gravure coat method, bar coat method, role coat method, wire bar coat method, dip coat method, spray coat method, screen printing method, flexo printing method, offset printing method, inkjet printing method and the like. From the standpoint of easiness of pattern formation and multicolor divisional painting, preferable are printing methods such as a screen printing method, flexographic printing method, offset printing method, inkjet printing method and the like.

The optimum value of the thickness of a hole transporting layer varies depending on a material to be used, and the thickness may be advantageously selected so as to give suitable driving voltage and light emission efficiency, and for example, 1 nm to 1 μm, preferably 2 nm to 500 nm, further preferably 5 nm to 200 nm.

In the polymer LED of the present invention, a light emitting material other than the light emitting material of the present invention may be mixed and used in a light emitting layer. Further, in the polymer LED of the present invention, a light emitting layer containing a light emitting material other than the light emitting material of the present invention may be laminated with a light emitting layer containing the light emitting material of the present invention.

As the light emitting material, known materials can be used. For compounds of low molecular weight, for example, naphthalene derivatives, anthracene or derivatives thereof, perylene or derivatives thereof; polymethine, xanthene, coumarin and cyanine coloring matters; metal complexes of 8-hydroxyquinoline or derivatives thereof; aromatic amines, tetraphenylcyclopentadiene or derivatives thereof, tetraphenylbutadiene or derivatives thereof, and the like can be used.

Specifically, known compounds such as those described in, for example, JP-A Nos. 57-51781, 59-194393, and the like can be used.

When the polymer LED of the present invention has a hole transport layer, exemplified as the hole transport material to be used are polyvinylcarbazole or derivatives thereof, polysilane or derivatives thereof, polysiloxane derivatives having an aromatic amine on the side chain or main chain, pyrazoline derivatives, arylamine derivatives, stilbene derivatives, triphenyldiamine derivatives, polyaniline or derivatives thereof, polythiophene or derivatives thereof, polypyrrole or derivatives thereof, poly(p-phenylenevinylene) or derivatives thereof, poly(2,5-thienylenevinylene) or derivatives thereof, and the like.

Specifically, exemplified as the hole transport material are those described in JP-A Nos. 63-70257, 63-175860, 2-135359, 2-135361, 2-209988, 3-37992 and 3-152184, and the like.

Among them, preferable as the hole transport material used in a hole transport layer are polymer hole transport materials such as polyvinylcarbazole or derivatives thereof, polsilane or derivatives thereof, polysiloxane derivatives having an aromatic amine compound group on the side chain or main chain, polyaniline or derivatives thereof, polythiophene or derivatives thereof, poly(p-phenylenevinylene) or derivatives thereof, poly(2,5-thienylenevinylene) or derivatives thereof, and the like, and polyvinylcarbazole or derivatives thereof, polsilane or derivatives thereof, and polysiloxane derivatives having an aromatic amine on the side chain or main chain are further preferable. In the case of the hole transport material of low molecular weight, dispersion in a polymer binder before use is preferable.

Polyvinylcarbazole or derivatives thereof are obtained, for example, from vinyl monomers by cation polymerization or radical polymerization.

As the polysilane or derivatives thereof, compounds described in Chem. Rev., vol. 89, p. 1359 (1989), GB Patent No. 2300196 publication, and the like are exemplified. Also as the synthesis method, methods described in them can be used, and particularly, the Kipping method is suitably used.

In the polysiloxane or derivatives thereof, the siloxane skeleton structure shows little hole transport property, thus, those having a structure of the above-mentioned hole transport material of low molecular weight on the side chain or main chain are suitably used Particularly, those having an aromatic amine showing a hole transport property on the side chain or main chain are exemplified.

The film formation method of a hole transport layer is not particularly restricted, and in the case of a hole transport material of low molecular weight, a method of film formation from a mixed solution with a polymer binder is exemplified. In the case of a hole transport material of high molecular weight, a method of film formation from a solution is exemplified.

The solvent used for film formation from a solution is not particularly restricted providing it can dissolve a hole transport material. Exemplified as the solvent are chlorine-based solvents such as chloroform, methylene chloride, 1,2-dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the method for film formation from a solution, there can be used application methods from a solution such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like.

As the polymer binder to be mixed, those not extremely disturbing electric charge transportation are preferable, and those showing no strong absorption for visible light are suitably used. As the polymer binder, exemplified are polycarbonate, polyacrylate, polymethyl acrylate, polymethyl methacrylate, polystyrene, polyvinyl chloride, polysiloxane and the like.

The thickness of a hole transport layer shows optimum value varying depending on the material to be used and may be advantageously selected so as to give suitable driving voltage and light emission efficiency, and at least thickness not causing generation of pin holes is necessary, and too large thickness causes increase in the driving voltage of a device, thus, is not preferable. Therefore, the thickness of the hole transport layer is, for example, 1 nm to 1 µm, preferably 2 nm to 500 nm, further preferably 5 nm to 200 nm.

When the polymer LED of the present invention has an electron transport layer, known materials can be used as the electron transport material to be used, and exemplified are oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes of 8-hydroxyquinoline or derivatives thereof, polyquinoline or derivatives thereof, polyquinoxaline or derivatives thereof, polyfluorene or derivatives thereof, and the like.

Specifically, those described in JP-A Nos. 63-70257, 63-175860, 2-135359, 2-135361, 2-209988, 3-37992, 3-152184, and the like are exemplified.

Of them, oxadiazole derivatives, benzoquinone or derivatives thereof, anthraquinone or derivatives thereof, metal complexes of 8-hydroxyquinoline or derivatives thereof, polyquinoline or derivatives thereof, polyquinoxaline or derivatives thereof, polyfluorene or derivatives thereof are preferable, and 2-(4-biphenylyl)-5-(4-t-butylphenyl)-1,3,4-oxadiazole, benzoquinone, anthraquinone, tris(8-quinolinol) aluminum and polyquinoline are further preferable.

The film formation method of an electron transport layer is not particularly restricted, and in the case of an electron transport material of low molecular weight, exemplified are a vacuum vapor-deposition method from powder, film formation methods from solution or melted condition, and in the case of an electron transport material of high molecular weight, film formation methods from solution or melted condition are exemplified, respectively. In film formation from solution or melted condition, the polymer binder may be used together.

The solvent used in film formation from a solution is not particularly restricted providing it can dissolve an electron transport material and/or polymer binder. Exemplified as the solvent are chlorine-based solvents such as chloroform, methylene chloride, dichloroethane and the like, ether solvents such as tetrahydrofuran and the like, aromatic hydrocarbon solvents such as toluene, xylene and the like, ketone solvents such as acetone, methyl ethyl ketone and the like, and ester solvents such as ethyl acetate, butyl acetate, ethylcellosolve acetate and the like.

As the film formation method from solution or melted condition, application methods such as a spin coat method, casting method, micro gravure coat method, gravure coat method, bar coat method, roll coat method, wire bar coat method, dip coat method, spray coat method, screen printing method, flexo printing method, offset printing method, inkjet printing method and the like can be used.

As the polymer binder to be mixed, those not extremely disturbing electric charge transportation are preferable, and those showing no strong absorption for visible light are suitably used. As the polymer binder, exemplified are poly(N-vinylcarbazole), polyaniline or derivatives thereof, polythiophene or derivatives thereof, poly(p-phenylenevinylene) or derivatives thereof, poly(2,5-thienylenevinylene) or derivatives thereof, polycarbonate, polyacrylate, polymethyl acrylate, polymethyl methacrylate, polystyrene, polyvinyl chloride, polysiloxane and the like.

The thickness of an electron transport layer shows optimum value varying depending on the material to be used and may be advantageously selected so as to give suitable driving voltage and light emission efficiency, and at least thickness not causing generation of pin holes is necessary, and too large thickness causes increase in the driving voltage of a device, thus, is not preferable. Therefore, the thickness of the electron transport layer is, for example, 1 nm to 1 µm, preferably 2 nm to 500 nm, further preferably 5 nm to 200 nm.

The substrate for forming the polymer LED of the present invention may advantageously be a substrate which does not vary in forming an electrode and forming each layer of the polymer LED, and for example, glass, plastic, polymer film, silicon substrates and the like are exemplified. In the case of an opaque substrate, it is preferable that the counter electrode is transparent or semi-transparent.

Usually, it is preferable that at least one of electrodes composed of an anode and a cathode is transparent or semi-transparent, and the anode side is transparent or semi-transparent.

As the material of the anode, an electric conductive metal oxide film, semi-transparent metal thin film and the like are used. Specifically, films (NESA and the like) formed using electric conductive glass composed of indium oxide, zinc oxide, tin oxide, and composite thereof: indium.tin.oxide (ITO), indium.zinc.oxide and the like, and gold, platinum, silver, copper and the like are used, and ITO, indium.zinc.oxide, tin oxide are preferable. As the manufacturing method, a vacuum vapor-deposition method, sputtering method, ion plating method, plating method and the like are mentioned. As the anode, organic transparent electric conductive films made of polyaniline or derivatives thereof, polythiophene or derivatives thereof, and the like may be used.

The thickness of an anode can be appropriately selected in view of light transmission and electric conductivity, and it is, for example, 10 nm to 10 μm, preferably 20 nm to 1 μm, further preferably 50 nm to 500 nm.

For making charge injection easy, a layer made of a phthalocyanine derivative, electric conductive polymer, carbon and the like, or a layer having an average thickness of not more than 2 nm made of a metal oxide, metal fluoride, organic insulation material and the like, may be provided on an anode.

As the material of a cathode used in the polymer LED of the present invention, materials of small work function are preferable. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like, alloys composed of two or more of them, or alloys composed of at least one of them and at least one of gold, silver, platinum, copper, manganese, titanium, cobalt, nickel, tungsten and tin, graphite or graphite intercalation compounds and the like are used. Examples of the alloy include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may take a laminated structure consisting of two or more layers.

The thickness of a cathode can be appropriately selected in view of electric conductivity and durability, and it is, for example, 10 nm to 10 μm, preferably 20 nm to 1 μm, further preferably 50 nm to 500 nm.

As the cathode manufacturing method, a vacuum vapor-deposition method, sputtering method, lamination method of thermally compression-binding a metal thin film, and the like are used. A layer made of an electric conductive polymer, or a layer having an average thickness of not more than 2 nm made of a metal oxide, metal fluoride, organic insulation material and the like, may be provided between a cathode and an organic substance layer, and after manufacturing a cathode, a protective layer for protecting the polymer LED may be installed. For use of the polymer LED stably for a long period of time, it is preferable to install a protective layer and/or protective cover, for protecting a device from outside.

As the protective layer, a polymer compound, metal oxide, metal fluoride, metal boride and the like can be used. As the protective cover, a glass plate, and a plastic plate having a surface subjected to a water permeation lowering treatment, and the like can be used, and a method of pasting the cover to a device substrate with a thermosetting resin or photo-curable resin to attain sealing is suitably used. When a space is kept using a spacer, blemishing of a device can be prevented easily. If an inert gas such as nitrogen, argon and the like is filled in this space, oxidation of a cathode can be prevented, further, by placing a drying agent such as barium oxide and the like in this space, it becomes easy to suppress moisture adsorbed in a production process from imparting damage to the device. It is preferable to adopt one strategy among these methods.

The polymer light emitting device of the present invention can be used as a sheet light source, or backlight of segment displays, dot matrix displays or liquid crystal displays.

For obtaining light emission in the form of sheet using the polymer LED of the present invention, it may be advantages to place a sheet anode and a sheet cathode so as to overlap. For obtaining light emission in the form of pattern, there are a method in which a mask having a window in the form of pattern is placed on the surface of the sheet light emitting device, a method in which an organic substance layer in non-light emitting parts is formed with extremely large thickness to give substantially no light emission, a method in which either an anode or cathode, or both electrodes are formed in the form pattern. By forming a pattern by any of these methods, and placing several electrodes so that on/off is independently possible, a display of segment type is obtained which can display digits, letters, simple marks and the like. Further, for providing a dot matrix device, it may be permissible that both an anode and a cathode are formed in the form of stripe, and placed so as to cross. By using a method in which several light emitting materials showing different emission colors are painted divisionally or a method in which a color filter or a light emission converting filter is used, partial color display and multi-color display are made possible. In the case of a dot matrix device, passive driving is possible, and active driving may be carried out in combination with TFT and the like. These display devices can be used as a display of a computer, television, portable terminal, cellular telephone, car navigation, view finder of video camera, and the like.

Further, the above-mentioned sheet light emitting device is of self emitting thin type, and can be used suitably as a sheet light source for back light of a liquid crystal display, or as a sheet light source for illumination. If a flexible substrate is used, it can also be used as a curved light source or display.

Examples for illustrating the present invention further in detail will be shown below, but the invention is not limited to them.

Here, the polystyrene-reduced number average molecular weight was measured by gel permeation chromatography (GPC: HLC-8220 GPC, manufactured by Tosoh Corporation, or SCL-10A, manufactured by Shimadzu Corp.) using tetrahydrofuran as a solvent.

EXAMPLE 1

A 1.0 wt % toluene solution of a mixture obtained by mixing the following fluorescent polymer compounds (1) and (2) and a phosphorescent compound (P1) at a ratio (by weight) of 79.8:19.9:0.3 was prepared.

On a glass substrate carrying thereon an ITO film having a thickness of 150 nm formed by a sputtering method, a solution of poly(ethylenedioxythiophene)/polystyrenesulfonic acid (manufactured by Bayer, BaytronP) was spin-coated to form a film having a thickness of 50 nm, and dried on a hot plate at 200° C. for 10 minutes. Next, the toluene solution prepared above was spin-coated at a rotation speed of 1000 rpm to form a film. Further, this was dried under reduced pressure at 80° C. for 1 hour, then, as a cathode buffer layer, LiF was vapor-deposited with a thickness of about 4 nm, and as a cathode, calcium was vapor-deposited with a thickness of about 5 nm, then, aluminum was vapor-deposited with a thickness of about 80 nm, to manufacture an EL device. After the degree of vacuum reached a value of not more than $1 \times 10^4$ Pa, vapor deposition of a metal was initiated. When voltage was applied on the resultant device, fluorescence emission (peak wavelength: 480 nm) derived from a mixture of the fluorescent polymer compounds (1) and (2) and emission (peak wavelength: 625 nm) derived from the phosphorescent compound (P1) were observed, obtaining white EL emission according to 9132 CIE chromaticity coordinate (0.34, 0.28). The fluorescent polymer compound (1) shows fluorescence having a peak wavelength of 435 nm, the fluorescent polymer compound (2) shows fluorescence having a peak wavelength of 480 nm, and the phosphorescent compound (P1) shows phosphorescence having a peak wavelength of 510 nm. The device showed light emission of 100 cd/m² at about 5 V, and the maximum luminance was not less than 30000 cd/m². The maximum light emission efficiency was 3.0 cd/A.

Fluorescent Polymer Compound (1)

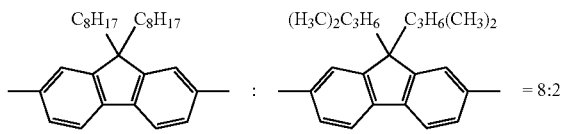

Fluorescent Polymer Compound (2)

The fluorescent polymer compounds (1) and (2) were synthesized according to a method described in JP-A No. 2004-143419.

This fluorescent polymer compound (1) had a polystyrene-reduced number average molecular weight Mn of $1.2 \times 10^4$ and a polystyrene-reduced weight average molecular weight Mw of $7.7 \times 10^4$. The fluorescent polymer compound (2) was synthesized according to a method described in JP-A No. 2004-002654, and had a polystyrene-reduced number average molecular weight Mn of $3.5 \times 10^5$ and a polystyrene-reduced weight average molecular weight Mw of $1.1 \times 10^6$. The phosphorescent compound (P1) was synthesized according to a method described in WO 03•040256A2.

The difference between the lowest excited triplet energy and the ground state energy of the fluorescent polymer compound (1) calculated by a computational scientific means was 2.08 eV. It was confirmed by the same means that the difference between the lowest excited triplet energy and the ground state energy of the fluorescent polymer compound (2) was larger than that of the fluorescent polymer compound (1). The difference between the lowest excited triplet energy and the ground state energy of the phosphorescent compound (P1) calculated by a computational scientific means was 2.00 eV. It was confirmed by the above-described facts that the fluorescent polymer compounds (1) and (2) have a difference between the lowest excited triplet energy and the ground state energy larger than that of the phosphorescent compound (P1).

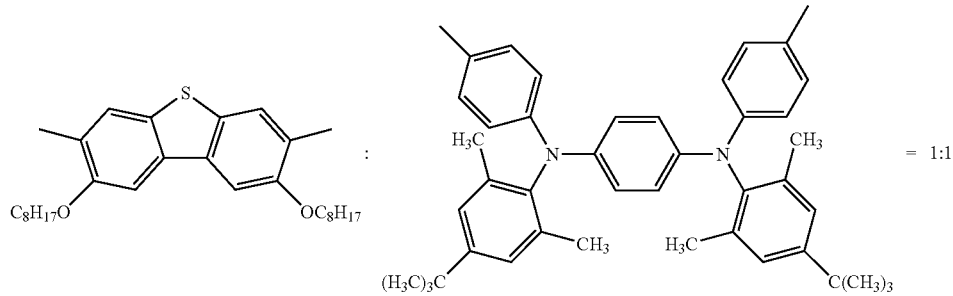

Phosphorescent Compound (P1)

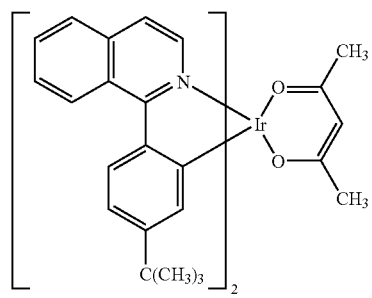

The chemical structure as the calculation subjected was

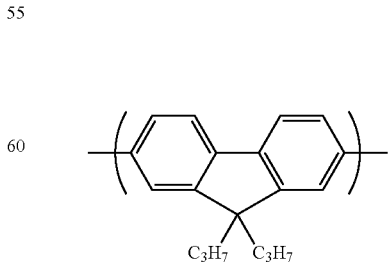

for the fluorescent polymer compound (1),

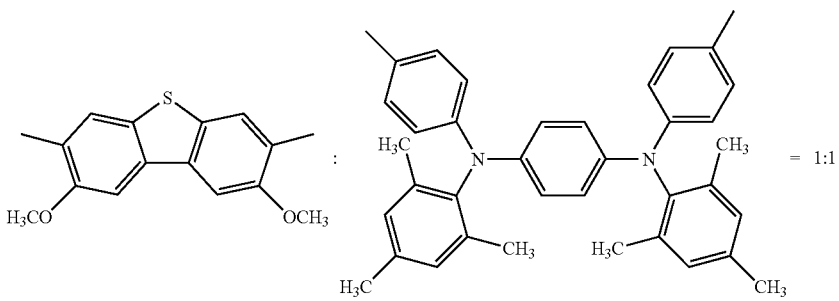

for the fluorescent polymer compound (2), and

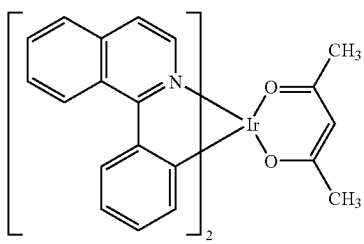

for the phosphorescent compound (P1). Calculation was carried out according to the method described in DETAILED DESCRIPTION OF PREFERRED EMBODIMENTS. Specifically, first, for the phosphorescent compound (P1), its structure was optimized by a density function method at B3LYP level. In this procedure, lan12dz was used as a basis function for iridium contained in the phosphorescent compound (P1) and 6-31g* was used as a basis function for other atoms contained in the phosphorescent compound (P1). Further, for the optimized structure, the same basis as for the structure optimization was used, and according to a time-dependent density function (TDDFT) method at B3LYP level, the lowest excited single energy and the lowest excited triple energy were measured. For the fluorescent polymer compound (1), its structure was optimized using the Hartree Fock method, and the lowest excited triple energy was measured by a time-dependent density function method at B3P86 level. In this procedure, 6-31g* was used as a basis function. With respect to adequateness for simplification of the calculated chemical structure as described above, it was confirmed that side chain length-dependency at the lowest excited triplet energy was small, by a method described in JP-A No. 2005-126686, and calculation was performed while simplifying an octyl group at 9,9' position of a fluorene ring in the chemical structure as the calculation subject as $CH_3$, for the fluorescent polymer compound (1), and simplifying an octoxy group at 3,6 position of a dibenzothiophene ring in the chemical structure as the calculation subject as $OCH_3$, for the fluorescent polymer compound (2).

Further, the proportion of the sum of squares of orbital coefficients of the outermost d orbital of a center metal in HOMO occupying the sum of squares of all atom orbital coefficients was 49%, for the phosphorescent compound (P1).

EXAMPLE 2

A 0.4 wt % chloroform solution of a mixture obtained by mixing the following fluorescent polymer compound (3) and the following phosphorescent compound (P2) at a ratio (by weight) of 99.7:0.3 was prepared, and an EL device was produced. The fluorescent polymer compound (3) was synthesized according to a method described in JP-A No. 2004-143419. The polystyrene-reduced number average molecular weight Mn was $3.0 \times 10^4$ and the polystyrene-reduced weight average molecular weight Mw was $2.6 \times 10^5$.

Fluorescent Polymer Compound (3)

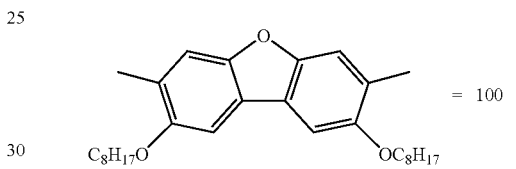

Phosphorescent Compound (P2)

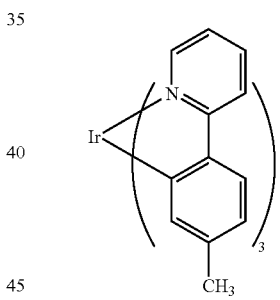

On a glass substrate carrying thereon an ITO film having a thickness of 150 nm formed by a sputtering method, a solution of poly(ethylenedioxythiophene)/polystyrenesulfonic acid (manufactured by Bayer, BaytronP) was spin-coated to form a film having a thickness of 50 nm, and dried on a hot plate at 200° C. for 10 minutes. Next, the chloroform solution prepared above was spin-coated at a rotation speed of 2500 rpm to form a film. Further, this was dried under a nitrogen gas atmosphere at 130° C. for 1 hour, then, as a cathode, barium was vapor-deposited with a thickness of about 5 nm, then, aluminum was vapor-deposited with a thickness of about 80 nm, to manufacture an EL device. After the degree of vacuum reached a value of not more than $1 \times 10^{-4}$ Pa, vapor deposition of a metal was initiated.

When voltage was applied on the resultant device, fluorescence emission (peak wavelength: 425 nm) derived from the fluorescent polymer compound (3) and emission (peak wavelength: 510 nm) derived from the phosphorescence emitting compound (P2) were observed, obtaining multicolor emission. The device showed light emission of 100 cd/m² at about 6 V, and the maximum luminance was as high as about 1000 cd/m². The fluorescent polymer compound (3) shows fluorescence having a peak wavelength of 425 nm.

The difference between the lowest excited triplet energy and the ground state energy of the phosphorescent compound (P2) calculated by a computational scientific means was 2.49 eV, which was higher by 0.15 eV than the difference (2.34 eV) between the lowest excited triplet energy and the ground state energy of the fluorescent polymer compound (3), satisfying the above-described (Eq 1). The proportion of the sum of squares of orbital coefficients of the outermost d orbital of a center metal in HOMO of the phosphorescent compound (2) occupying the sum of squares of all atom orbital coefficients was 54%, being not less than one-third.

The chemical structure as the calculation subjected was

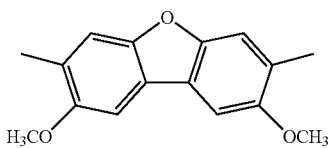

for the fluorescent polymer compound (3). Calculation was carried out in the same manner as in Example 1.

COMPARATIVE EXAMPLE 1

An EL device was produced in the same manner as in Example 2 using the fluorescent polymer compound (1) instead of the fluorescent polymer compound (3) described in Example 2. A light emission layer was formed at a rotation speed of 3000 rpm by spin coat. When voltage was applied on the resultant device, fluorescence emission (peak wavelengths: 425, 450, 480 nm) derived from the fluorescent polymer compound (1) and emission (peak wavelength: 510 nm) derived from the phosphorescence emitting compound (P2) were observed, however, its intensity was extremely weak, and the maximum luminance was only 120 cd/m².

The difference between the lowest excited triplet energy and the ground state energy of the phosphorescent compound (P2) calculated by a computational scientific means was 2.49 eV, which was higher by 0.42 eV than the difference (2.07 eV) between the lowest excited triplet energy and the ground state energy of the fluorescent polymer compound (1), not satisfying the above-described (Eq 1).

EXAMPLE 3

A 0.4 wt % chloroform solution of a mixture obtained by mixing the fluorescent polymer compound (3) described in Example 2 and the phosphorescent compound (P1) described in Example 1 at a ratio (by weight) of 99.8:0.2 was prepared, and an EL device was produced in the same manner as in Example 2. A light emission layer was formed at a rotation speed of 2500 rpm by spin coat. When voltage was applied on the resultant device, fluorescence emission (peak wavelength: 415 nm) derived from the fluorescent polymer compound (3) and emission (peak wavelength: 625 nm) derived from the phosphorescent compound (P1) were observed, obtaining multicolor emission. The device showed light emission of 100 cd/m² at about 6 V, and the maximum luminance was as high as about 1000 cd/m².

The difference between the lowest excited triplet energy and the ground state energy of the phosphorescent compound (P1) calculated by a computational scientific means was 2.00 eV, which was lower by 0.34 eV than the difference (2.34 eV) between the lowest excited triplet energy and the ground state energy of the fluorescent polymer compound (3), satisfying the above-described (Eq 1). Calculation was carried out in the same manner as described in Example 1.

COMPARATIVE EXAMPLE 2

An EL device was produced in the same manner as in Example 3 using the following phosphorescent compound (P1-R) instead of the phosphorescent compound (P1) described in Example 3. A light emission layer was formed at a rotation speed of 2500 rpm by spin coat. (P1-R) was obtained from American Dye Source.

Phosphorescent Compound (P1-R)

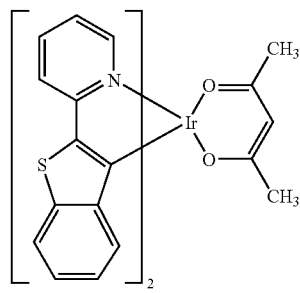

When voltage was applied on the resultant device, fluorescence emission (peak wavelength: 415 nm) derived from the fluorescent polymer compound (3) was observed, however, emission derived from the phosphorescence emitting compound (P1-R) was not observed, obtaining no multicolor emission.

The difference between the lowest excited triplet energy and the ground state energy of the phosphorescent compound (P1-R) calculated by a computational scientific means was 1.98 eV, which was lower by 0.36 eV than the difference (2.34 eV) between the lowest excited triplet energy and the ground state energy of the fluorescent polymer compound (3), satisfying the above-described (Eq 1). However, the proportion of the sum of squares of orbital coefficients of the outermost d orbital of a center metal in HOMO of the phosphorescent compound (P1-R) occupying the sum of squares of all atom orbital coefficients was 31%, being less than one-third. Calculation was carried out in the same manner as described in Example 1.

EXAMPLE 4

A 1.7 wt % toluene solution of a mixture obtained by mixing the following polymer phosphorescence emitting compound (4), fluorescent polymer compounds (3) and (5) at a ratio (by weight) of 17:50:33 was prepared.

An EL device was produced in the same manner as in Example 1 using this solution. A light emission layer was formed at a rotation speed of 1300 rpm by spin coat.

When voltage was applied on the resultant device, phosphorescence emission (peak wavelength: 620 nm) derived from the polymer phosphorescence emitting compound (4) and fluorescence emission (peak wavelength: 470 nm) derived from a mixture of the polymer compounds (3) and (5) were observed, obtaining white EL emission according to 9132 CIE chromaticity coordinate (0.33, 0.30). The device showed light emission of 100 cd/m² at about 8 V, and the maximum light emission efficiency was about 2 cd/A. The polymer compound (5) shows fluorescence having a peak wavelength of 460 nm.

Polymer Phosphorescence Emitting Compound (4)

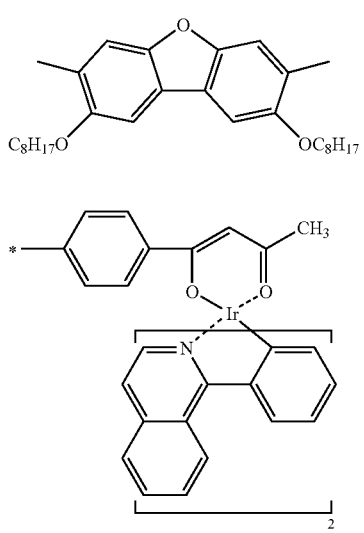

(wherein, (4-1) shows a main chain part of the polymer and (4-2) shows an end group of the polymer. * shows a part connected to the polymer main chain.)

Fluorescent Polymer Compound (3)

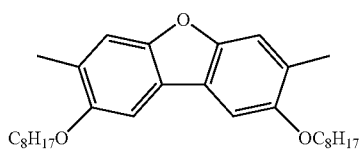

Fluorescent Polymer Compound (5)

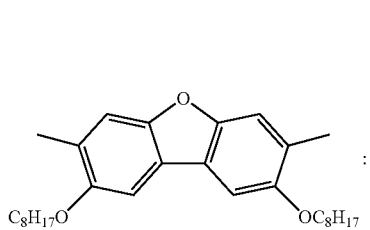

The polymer phosphorescence emitting compound (4) was synthesized according to a method described in JP-A No. 2005-226066. This polymer compound (4) had a polystyrene-reduced number average molecular weight Mn of $3.6 \times 10^4$ and a polystyrene-reduced weight average molecular weight Mw of $7.3 \times 10^4$. The fluorescent polymer compounds (3) and (5) were synthesized according to a method described in JP-A No. 2004-059899, and had a polystyrene-reduced number average molecular weight Mn of $3.0 \times 10^4$ and Mn of $2.8 \times 10^4$ and a polystyrene-reduced weight average molecular weight Mw of $2.6 \times 10^5$ and Mw of $1.1 \times 10^5$, respectively.

The difference between the lowest excited triplet energy and the ground state energy of a phosphorescence emitting part of the polymer phosphorescence emitting compound (4) calculated by a computational scientific means was 2.00 eV, the difference between the lowest excited triplet energy and the ground state energy of other parts was 2.34 eV, and the difference between the lowest excited triplet energy and the ground state energy of the polymer compound (3) was 2.34 eV. It was confirmed that the difference between the lowest excited triplet energy and the ground state energy of the fluorescent polymer compound (5) was larger than that of the fluorescent polymer compound (3). It was confirmed by the above-described facts that polymer parts other than a phosphorescence emitting part of the polymer phosphorescence emitting compound (4), and the polymer compounds (3) and (5) had a difference between the lowest excited triplet energy and the ground state energy larger than that of the phosphorescence emitting part of the polymer phosphorescence emitting compound (4).

Regarding the chemical structure as the calculation subject, the phosphorescence emitting part of the polymer phosphorescence emitting compound (4) used the same calculation subject structure as for the phosphorescent compound (P1) described in Example 1, and polymer parts other than the phosphorescence emitting part of the polymer phosphorescence emitting compound (4), and the fluorescent polymer compound (3) used

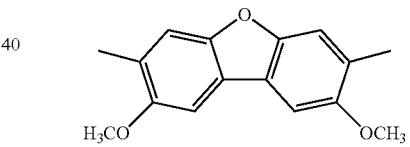

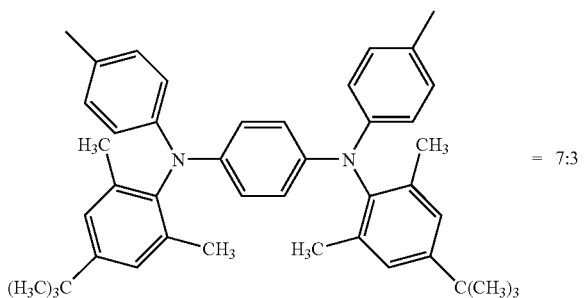

Also for the polymer compound (4), the same chemical structure as described above was used as the calculation subject. The polymer compound (5) used

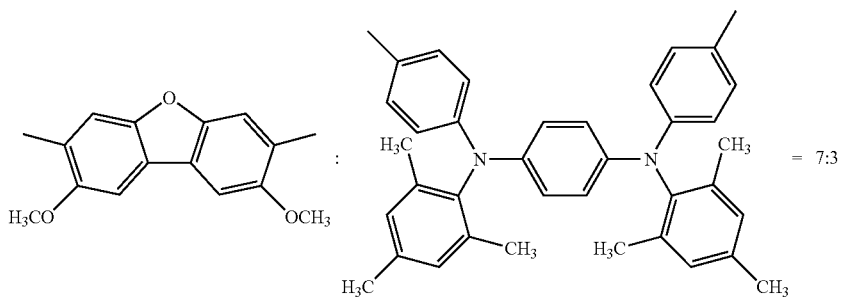

as the chemical structure as the calculation subject. Calculation was carried out in the same manner as described in Example 1.

Industrial Applicability

A device using the polymer material of the present invention is capable of showing multicolor light emission and white light emission, and excellent in practical abilities such as drivability at low voltage, good light emission efficiency and the like. Therefore, the polymer material of the present invention can be used suitably as a light emitting material for polymer LED.

What is claimed is:

1. A polymer material comprising a composition containing a fluorescent conjugated polymer (A) and a phosphorescent compound (B) or comprising a polymer having the structure of (A) and the structure of (B) in the same molecule, wherein the following conditions (1), (2) and (3) are satisfied:
   (1) at least one of the light emission peak wavelengths of the fluorescent conjugated polymer (A) is less than 500 nm,
   (2) the light emission peak wavelengths of the phosphorescent compound (B) are not less than 500 nm,
   (3) the following relation is satisfied:

$$ET_A - ES_{A\,0} \geq (ET_B - ES_B) - 0.2 \text{ (unit; eV)} \quad \text{(Eq 1)}$$

(wherein, $ES_{A\,0}$ represents energy of the fluorescent conjugated polymer (A) at the ground state, $ET_A$ represents energy of the fluorescent conjugated polymer (A) at the lowest excited triplet state, $ES_{B\,0}$ represents energy of the phosphorescent compound (B) at the ground state, and $ET_B$ represents energy of the phosphorescent compound (B) at the lowest excited triplet state).

2. The polymer material according to claim 1, wherein the polymer material is a polymer having the structure of the fluorescent conjugated polymer (A) and the structure of the phosphorescent compound (B) in the same molecule.

3. The polymer material according to claim 2, wherein the polymer material is a polymer having the structure of the phosphorescent compound (B) on the main chain of the fluorescent conjugated polymer (A).

4. The polymer material according to claim 2, wherein the polymer material is a polymer having the structure of the phosphorescent compound (B) on the end of the fluorescent conjugated polymer (A).

5. The polymer material according to claim 2, wherein the polymer material is a polymer having the structure of the phosphorescent compound (B) on the side chain of the fluorescent conjugated polymer (A).

6. The polymer material according to claim 1, wherein the polymer material is a composition containing the fluorescent conjugated polymer (A) and the phosphorescent compound (B).

7. The polymer material according to claim 1, wherein the fluorescent conjugated polymer (A) contains an aromatic ring in the main chain.

8. The polymer material according to claim 1, wherein the fluorescent conjugated polymer (A) has an optionally substituted benzene ring and/or the following general formula (1) as a partial structure:

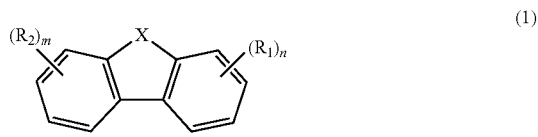

wherein, m and n represent each independently an integer of 0 to 4, $R_1$ and $R_2$ represent each independently a hydrogen atom, halogen atom, alkyl group, alkoxy group, aryl group, or connecting bond with other atom; when there are a plurality of $R_1$s and a plurality of $R_2$s, they may be the same or different; X represents —O—, —S—, —Se—, —B($R_{3\,1}$)—, —Si($R_{3\,2}$)($R_{3\,3}$)—, —P($R_{3\,4}$)—, —PR$_4$(=O)—, —N($R_{3\,5}$)—, —C($R_{3\,6}$)($R_{3\,7}$)—, —C($R_{5\,1}$)($R_{5\,2}$)—C($R_{5\,3}$)($R_{5\,4}$)—, —O—C($R_{5\,5}$)($R_{5\,6}$), —S—C($R_{5\,7}$)($R_{5\,8}$)—, —N—C($R_{5\,9}$)($R_{6\,0}$)—, —Si($R_{6\,1}$)($R_{6\,2}$)—C($R_{6\,3}$)($R_{6\,4}$)—, —Si($R_{6\,5}$)($R_{6\,6}$)Si($R_{6\,7}$)($R_{6\,8}$)—, —C($R_{6\,9}$)=C($R_{7\,0}$)—, —N=C($R_{7\,1}$)— or —Si($R_{7\,2}$)=C($R_{7\,3}$);

here, $R_{3\,1}$ represents hydrogen, alkyl group, alkenyl group, alkynyl group, alkoxy group, alkylthio group, aryl group, aryloxy group, arylthio group, arylalkyl group, arylalkoxy group, arylalkylthio group, arylalkenyl group, arylalkynyl group, monovalent heterocyclic group or halogen atom; and $R_{3\,2}$ to $R_{3\,7}$ and $R_{5\,1}$ to $R_{7\,3}$ represent each independently an alkyl group, alkenyl group, alkynyl group, alkoxy group, alkylthio group, aryl group, aryloxy group, arylthio group, arylalkyl group, arylalkoxy group, arylalkylthio group, arylalkenyl group, arylalkynyl group, monovalent heterocyclic group or halogen atom.

9. The polymer material according to claim 1, wherein the phosphorescent compound (B) has a metal complex as a partial structure.

10. The polymer material according to claim 9, wherein the proportion of the sum of squares of orbital coefficients of the outermost d orbital of a center metal in the highest occupied molecular orbital (HOMO) calculated by a computational scientific means occupying the sum of squares of orbital coefficients of all orbitals is not less than one-third.

11. The polymer material according to claim 1, further comprising at least one material selected from hole transporting materials, electron transporting materials and light emitting materials.

12. A liquid composition comprising at least one polymer material as described in claim 1.

13. The liquid composition according to claim 12, wherein the viscosity is 1 to 100 mPa.s at 25° C.

14. A light emitting device having a layer containing the polymer material as described in claim 1 between electrodes composed of an anode and a cathode.

15. The light emitting device according to claim 14, further having a charge transport layer and/or a charge block layer between electrodes composed of an anode and a cathode.

* * * * *